(12) United States Patent
Abediasl et al.

(10) Patent No.: US 11,105,975 B2
(45) Date of Patent: Aug. 31, 2021

(54) WAVEGUIDE OPTOELECTRONIC DEVICE

(71) Applicant: ROCKLEY PHOTONICS LIMITED, London (GB)

(72) Inventors: Hooman Abediasl, Pasadena, CA (US); Damiana LeRose, Pasadena, CA (US); Amit Singh Nagra, Altadena, CA (US); Guomin Yu, Glendora, CA (US)

(73) Assignee: Rockley Photonics Limited, Oxford (GB)

( * ) Notice: Subject to any disclaimer, the term of this patent is extended or adjusted under 35 U.S.C. 154(b) by 0 days.

(21) Appl. No.: 16/465,535

(22) PCT Filed: Dec. 1, 2017

(86) PCT No.: PCT/EP2017/081186
§ 371 (c)(1),
(2) Date: May 30, 2019

(87) PCT Pub. No.: WO2018/100157
PCT Pub. Date: Jun. 7, 2018

(65) Prior Publication Data
US 2020/0012043 A1    Jan. 9, 2020

Related U.S. Application Data

(60) Provisional application No. 62/429,701, filed on Dec. 2, 2016.

(51) Int. Cl.
*G02F 1/025* (2006.01)
*G02F 1/017* (2006.01)
(Continued)

(52) U.S. Cl.
CPC .............. *G02B 6/12* (2013.01); *G02F 1/025* (2013.01); *H01L 31/02327* (2013.01);
(Continued)

(58) Field of Classification Search
CPC .. G02F 1/01708; G02F 2202/108; G02B 6/00
(Continued)

(56) References Cited

U.S. PATENT DOCUMENTS 4,093,345 A    6/1978 Logan et al.
4,720,468 A    1/1988 Menigaux et al.
(Continued)

FOREIGN PATENT DOCUMENTS

CN    101529306 A    9/2009
CN    101868745 A    10/2010
(Continued)

OTHER PUBLICATIONS

Feng, Dazeng et al., "High-Speed GeSi Electroabsorption Modulator on the SOI Waveguide Platform", IEEE Journal of Selected Topics in Quantum Electronics, Nov./Dec. 2013, 10 pages, vol. 19, No. 6, IEEE.
(Continued)

*Primary Examiner* — Kaveh C Kianni
(74) *Attorney, Agent, or Firm* — Lewis Roca Rothgerber Christie LLP

(57) ABSTRACT

A waveguide optoelectronic device comprising a rib waveguide region, and method of manufacturing a rib waveguide region, the rib waveguide region having: a base of a first material, and a ridge extending from the base, at least a portion of the ridge being formed from a chosen semiconductor material which is different from the material of the base wherein the silicon base includes a first slab region at a first side of the ridge and a second slab region at a second side of the ridge; and wherein: a first doped region extends along: the first slab region and along a first sidewall of the ridge, the first sidewall contacting the first slab region; and a second doped region extends along: the second slab region
(Continued)

and along a second sidewall of the ridge, the second sidewall contacting the second slab region.

20 Claims, 12 Drawing Sheets

(51) Int. Cl.
    *H01L 31/0232*    (2014.01)
    *G02B 6/12*    (2006.01)
    *G02F 1/015*    (2006.01)

(52) U.S. Cl.
    CPC .............. *G02B 2006/12061* (2013.01); *G02B 2006/12097* (2013.01); *G02F 1/0157* (2021.01)

(58) Field of Classification Search
    USPC .......................................................... 385/14
    See application file for complete search history.

(56) References Cited

U.S. PATENT DOCUMENTS

| | | |
|---|---|---|
| 4,739,287 A | 4/1988 | Staupendahl et al. |
| 4,943,133 A | 7/1990 | Deri et al. |
| 4,961,619 A * | 10/1990 | Hernandez-Gil .... G02B 6/2804 385/130 |
| 5,157,756 A * | 10/1992 | Nishimoto ............. G02B 6/125 385/129 |
| 5,163,118 A * | 11/1992 | Lorenzo ................. G02B 6/122 385/123 |
| 5,297,233 A * | 3/1994 | Lerminiaux ........... G02B 6/125 385/27 |
| 5,438,444 A | 8/1995 | Tayonaka et al. |
| 5,446,751 A | 8/1995 | Wake |
| 5,511,088 A | 4/1996 | Loualiche et al. |
| 5,524,076 A | 6/1996 | Rolland et al. |
| 5,559,624 A | 9/1996 | Darcie et al. |
| 5,581,396 A | 12/1996 | Kubota et al. |
| 5,715,076 A | 2/1998 | Alexander et al. |
| 5,726,784 A | 3/1998 | Alexander et al. |
| 5,757,986 A | 5/1998 | Crampton et al. |
| 5,784,184 A | 7/1998 | Alexander et al. |
| 5,861,966 A | 1/1999 | Ortel |
| 5,894,535 A * | 4/1999 | Lemoff .................. G02B 6/125 385/14 |
| 5,908,305 A | 6/1999 | Crampton et al. |
| 5,911,018 A * | 6/1999 | Bischel ................... G02F 1/011 385/11 |
| 5,917,642 A | 6/1999 | O'Donnell et al. |
| 5,999,300 A | 12/1999 | Davies et al. |
| 6,061,487 A * | 5/2000 | Toyama ................ G02F 1/3137 385/47 |
| 6,222,951 B1 * | 4/2001 | Huang ............... H04B 10/2587 385/14 |
| 6,229,189 B1 | 5/2001 | Yap et al. |
| 6,233,077 B1 | 5/2001 | Alexander et al. |
| 6,298,177 B1 | 10/2001 | House |
| 6,349,106 B1 | 2/2002 | Coldren |
| 6,396,801 B1 | 5/2002 | Upton et al. |
| 6,438,279 B1 * | 8/2002 | Craighead ............. G02B 6/136 356/246 |
| 6,445,839 B1 | 9/2002 | Miller |
| 6,549,313 B1 | 4/2003 | Doerr et al. |
| 6,563,627 B2 | 5/2003 | Yoo |
| 6,580,739 B1 | 6/2003 | Coldren |
| 6,584,239 B1 | 6/2003 | Dawnay et al. |
| 6,597,824 B2 | 7/2003 | Newberg et al. |
| 6,614,819 B1 | 9/2003 | Fish et al. |
| 6,636,662 B1 | 10/2003 | Thompson et al. |
| 6,678,479 B1 | 1/2004 | Naoe et al. |
| 6,680,791 B2 | 1/2004 | Demir et al. |
| 6,710,911 B2 | 3/2004 | LoCascio et al. |
| 6,768,827 B2 | 7/2004 | Yoo |
| 6,845,198 B2 | 1/2005 | Montgomery et al. |
| 6,873,763 B2 | 3/2005 | Nikonov |
| 6,915,047 B1 * | 7/2005 | Mekis .................... G02B 6/125 385/14 |
| 7,031,617 B2 | 4/2006 | Zucchelli et al. |
| 7,085,443 B1 | 8/2006 | Gunn, III et al. |
| 7,092,609 B2 | 8/2006 | Yegnanarayanan et al. |
| 7,133,576 B2 | 11/2006 | Coldren et al. |
| 7,174,058 B2 | 2/2007 | Coldren et al. |
| 7,180,148 B2 | 2/2007 | Morse |
| 7,184,438 B2 | 2/2007 | Loge et al. |
| 7,256,929 B1 | 8/2007 | Rong et al. |
| 7,257,283 B1 * | 8/2007 | Liu ..................... G02B 6/12004 385/14 |
| 7,263,247 B1 * | 8/2007 | Hehlen .................. G02B 6/126 385/14 |
| 7,391,801 B1 * | 6/2008 | Soref ..................... H01S 5/026 372/92 |
| 7,394,948 B1 | 7/2008 | Zheng et al. |
| 7,397,101 B1 * | 7/2008 | Masini .................. H01L 31/028 257/184 |
| 7,418,166 B1 | 8/2008 | Kapur et al. |
| 7,505,686 B2 | 3/2009 | Jennen |
| 7,536,067 B2 | 5/2009 | Handelman |
| 7,558,487 B2 | 7/2009 | Liu et al. |
| 7,570,844 B2 | 8/2009 | Handelman |
| 7,603,016 B1 * | 10/2009 | Soref ...................... B82Y 20/00 385/129 |
| 7,747,122 B2 | 6/2010 | Shetrit et al. |
| 7,811,844 B2 | 10/2010 | Carothers et al. |
| 7,826,700 B2 | 11/2010 | Knights et al. |
| 7,885,492 B2 | 2/2011 | Welch et al. |
| 7,916,377 B2 | 3/2011 | Vvitzens et al. |
| 7,920,790 B2 | 4/2011 | Toliver |
| 7,941,014 B1 | 5/2011 | Watts et al. |
| 8,053,790 B2 | 11/2011 | Feng et al. |
| 8,073,029 B2 | 12/2011 | Hashimoto |
| 8,093,080 B2 * | 1/2012 | Liao ..................... G02B 6/1228 438/38 |
| 8,106,379 B2 * | 1/2012 | Bowers ............... H01L 31/0304 257/14 |
| 8,160,404 B2 | 4/2012 | Pan et al. |
| 8,242,432 B2 | 8/2012 | Feng et al. |
| 8,346,028 B2 * | 1/2013 | Feng ....................... G02F 1/025 385/8 |
| 8,362,494 B2 | 1/2013 | Lo et al. |
| 8,401,385 B2 | 3/2013 | Spivey et al. |
| 8,403,571 B2 | 3/2013 | Walker |
| 8,410,566 B2 | 4/2013 | Qian et al. |
| 8,411,260 B1 * | 4/2013 | Feng .................. G02B 6/12004 356/73.1 |
| 8,493,976 B2 | 7/2013 | Lin |
| 8,693,811 B2 | 4/2014 | Morini et al. |
| 8,724,988 B2 | 5/2014 | Andriolli et al. |
| 8,737,772 B2 | 5/2014 | Dong et al. |
| 8,767,792 B2 * | 7/2014 | Bowers .................. H01S 5/141 372/75 |
| 8,774,625 B2 | 7/2014 | Binkert et al. |
| 8,792,787 B1 | 7/2014 | Zhao et al. |
| 8,817,354 B2 | 8/2014 | Feng et al. |
| 8,942,559 B2 | 1/2015 | Binkert et al. |
| 9,128,309 B1 | 9/2015 | Robertson |
| 9,142,698 B1 | 9/2015 | Cunningham et al. |
| 9,182,546 B2 | 11/2015 | Prosyk et al. |
| 9,229,249 B2 | 1/2016 | Akiyama |
| 9,279,936 B2 | 3/2016 | Qian et al. |
| 9,282,384 B1 | 3/2016 | Graves |
| 9,306,698 B2 | 4/2016 | Chen et al. |
| 9,329,415 B2 * | 5/2016 | Song .................... H01P 11/003 |
| 9,411,177 B2 | 8/2016 | Cunningham et al. |
| 9,438,970 B2 | 9/2016 | Jones et al. |
| 9,448,425 B2 | 9/2016 | Ogawa et al. |
| 9,500,807 B2 * | 11/2016 | Oka ......................... G02B 6/14 |
| 9,513,498 B2 | 12/2016 | Jones et al. |
| 9,541,775 B2 | 1/2017 | Ayazi et al. |
| 9,548,811 B2 | 1/2017 | Kucharski et al. |
| 9,575,337 B2 | 2/2017 | Adams et al. |
| 9,668,037 B2 | 5/2017 | Jones et al. |
| 9,709,738 B1 * | 7/2017 | Dumais ................... G02B 6/14 |

(56) References Cited

U.S. PATENT DOCUMENTS

| | | |
|---|---|---|
| 9,733,542 B2 | 8/2017 | Bai |
| 9,995,877 B2 * | 6/2018 | Nakamura ............. G02B 6/125 |
| 10,128,957 B2 | 11/2018 | Welch et al. |
| 10,133,094 B1 | 11/2018 | Yu et al. |
| 10,135,542 B2 | 11/2018 | Nagra et al. |
| 10,185,203 B1 | 1/2019 | Yu et al. |
| 10,191,350 B2 | 1/2019 | Yu et al. |
| 10,216,059 B2 | 2/2019 | Yu et al. |
| 10,222,677 B2 | 3/2019 | Yu et al. |
| 10,231,038 B2 | 3/2019 | Rickman et al. |
| 10,340,661 B2 * | 7/2019 | Caer ...................... H01S 5/227 |
| 10,401,656 B2 | 9/2019 | Yu et al. |
| 10,678,115 B2 | 6/2020 | Yu et al. |
| 2001/0030787 A1 | 10/2001 | Tajima |
| 2001/0040907 A1 | 11/2001 | Chakrabarti |
| 2002/0048289 A1 | 4/2002 | Atanackovic et al. |
| 2002/0102046 A1 | 8/2002 | Newberg et al. |
| 2002/0154847 A1 | 10/2002 | Dutt et al. |
| 2002/0159117 A1 | 10/2002 | Nakajima et al. |
| 2002/0172464 A1 * | 11/2002 | Delwala .................. G02F 1/295 385/40 |
| 2002/0186453 A1 | 12/2002 | Yoo |
| 2003/0003734 A1 * | 1/2003 | Delwala ............. G02B 6/12026 438/689 |
| 2003/0003735 A1 * | 1/2003 | Deliwala ............. G02B 6/1225 438/689 |
| 2003/0003736 A1 * | 1/2003 | Delwala ............... G02B 6/1225 438/689 |
| 2003/0003737 A1 * | 1/2003 | Delwala .................. G02F 1/025 438/689 |
| 2003/0003738 A1 * | 1/2003 | Delwala ............. G02B 6/12011 438/689 |
| 2003/0031445 A1 | 2/2003 | Parhami et al. |
| 2003/0063362 A1 | 4/2003 | Demir et al. |
| 2003/0095737 A1 | 5/2003 | Welch et al. |
| 2003/0118286 A1 * | 6/2003 | Kamei .................. G02B 6/1228 385/37 |
| 2003/0133641 A1 | 7/2003 | Yoo |
| 2003/0142943 A1 | 7/2003 | Yegnanarayanan et al. |
| 2003/0156789 A1 | 8/2003 | Bhardwaj et al. |
| 2003/0176075 A1 | 9/2003 | Khan et al. |
| 2003/0223672 A1 | 12/2003 | Joyner et al. |
| 2004/0008395 A1 | 1/2004 | McBrien et al. |
| 2004/0013429 A1 | 1/2004 | Duelk et al. |
| 2004/0033004 A1 | 2/2004 | Welch et al. |
| 2004/0069984 A1 * | 4/2004 | Estes .................... G02B 6/4201 257/25 |
| 2004/0126052 A1 * | 7/2004 | Kamei ............... G02B 6/12011 385/14 |
| 2004/0126057 A1 | 7/2004 | Yoo |
| 2004/0151423 A1 * | 8/2004 | Izhaky .................. G02F 1/3136 385/21 |
| 2004/0190830 A1 * | 9/2004 | Rasras ................... G02B 6/125 385/39 |
| 2004/0207016 A1 * | 10/2004 | Patel ................. H01L 27/14636 257/347 |
| 2004/0208454 A1 | 10/2004 | Montgomery et al. |
| 2004/0246557 A1 | 12/2004 | Lefevre et al. |
| 2004/0251468 A1 * | 12/2004 | Mouli ............... H01L 27/14609 257/80 |
| 2004/0258347 A1 * | 12/2004 | Gothoskar ............ G02B 6/124 385/14 |
| 2005/0053377 A1 | 3/2005 | Yoo |
| 2005/0089269 A1 | 4/2005 | Cheng et al. |
| 2005/0089273 A1 | 4/2005 | Squires et al. |
| 2005/0189591 A1 * | 9/2005 | Gothoskar ............... G02F 1/025 257/347 |
| 2005/0236619 A1 * | 10/2005 | Patel .................. H01L 27/1443 257/57 |
| 2005/0286850 A1 | 12/2005 | German et al. |
| 2006/0023989 A1 * | 2/2006 | Yanagisawa ......... G02B 6/2938 385/14 |
| 2006/0133716 A1 * | 6/2006 | Little .................. G02B 6/2804 385/14 |
| 2006/0140528 A1 | 6/2006 | Coldren et al. |
| 2006/0177173 A1 * | 8/2006 | Shastri .................... G02F 1/025 385/14 |
| 2006/0251371 A1 * | 11/2006 | Schmidt ............. G01N 21/6454 385/129 |
| 2006/0257065 A1 | 11/2006 | Coldren et al. |
| 2007/0065076 A1 | 3/2007 | Grek et al. |
| 2007/0092193 A1 * | 4/2007 | Yokino ............... G02B 6/12007 385/129 |
| 2007/0104422 A1 * | 5/2007 | Watanabe ............... G02B 6/125 385/39 |
| 2007/0104441 A1 | 5/2007 | Ahn et al. |
| 2007/0280309 A1 | 12/2007 | Liu |
| 2008/0013881 A1 | 1/2008 | Welch et al. |
| 2008/0073744 A1 * | 3/2008 | Masini .................. H01L 31/109 257/466 |
| 2008/0095486 A1 | 4/2008 | Shastri et al. |
| 2008/0138088 A1 | 6/2008 | Welch et al. |
| 2008/0260320 A1 * | 10/2008 | Laval ...................... G02F 1/025 385/2 |
| 2008/0267239 A1 * | 10/2008 | Hall ......................... H01S 5/22 372/46.013 |
| 2009/0003841 A1 | 1/2009 | Ghidini et al. |
| 2009/0016666 A1 * | 1/2009 | Kuo ................... G02B 6/12004 385/2 |
| 2009/0142019 A1 * | 6/2009 | Popovic .................. G02B 6/10 385/28 |
| 2009/0169149 A1 | 7/2009 | Block |
| 2009/0185804 A1 | 7/2009 | Kai et al. |
| 2009/0245298 A1 | 10/2009 | Sysak et al. |
| 2009/0324164 A1 * | 12/2009 | Reshotko .................. G02B 6/42 385/14 |
| 2010/0002994 A1 | 1/2010 | Baehr-Jones et al. |
| 2010/0060970 A1 | 3/2010 | Chen |
| 2010/0060972 A1 | 3/2010 | Kucharski et al. |
| 2010/0078680 A1 | 4/2010 | Cheng et al. |
| 2010/0080504 A1 | 4/2010 | Shetrit et al. |
| 2010/0128336 A1 | 5/2010 | Witzens et al. |
| 2010/0135347 A1 | 6/2010 | Deladurantaye et al. |
| 2010/0166363 A1 * | 7/2010 | Matsuoka ............. G02B 6/4214 385/14 |
| 2010/0200733 A1 | 8/2010 | McLaren et al. |
| 2010/0247021 A1 * | 9/2010 | Cunningham .......... G02F 1/025 385/1 |
| 2010/0247022 A1 * | 9/2010 | Li ...................... G02B 6/12007 385/1 |
| 2010/0247029 A1 * | 9/2010 | Li ......................... G02F 1/0147 385/14 |
| 2010/0290732 A1 | 11/2010 | Gill |
| 2010/0296768 A1 | 11/2010 | Wu et al. |
| 2010/0310208 A1 | 12/2010 | Wang et al. |
| 2010/0330727 A1 * | 12/2010 | Hill ......................... G02F 1/025 438/69 |
| 2011/0013905 A1 | 1/2011 | Wang et al. |
| 2011/0013911 A1 | 1/2011 | Alexander et al. |
| 2011/0142390 A1 | 6/2011 | Feng et al. |
| 2011/0142391 A1 | 6/2011 | Asghari et al. |
| 2011/0180795 A1 | 7/2011 | Lo et al. |
| 2011/0200333 A1 | 8/2011 | Schrenk et al. |
| 2011/0206313 A1 * | 8/2011 | Dong ....................... G02F 1/025 385/2 |
| 2011/0215344 A1 * | 9/2011 | Dardy ...................... G02F 1/025 257/83 |
| 2011/0293279 A1 | 12/2011 | Lam et al. |
| 2011/0299561 A1 * | 12/2011 | Akiyama .............. H01S 5/02325 372/50.11 |
| 2012/0033910 A1 * | 2/2012 | Morini .................... G02F 1/025 385/3 |
| 2012/0080672 A1 | 4/2012 | Rong et al. |
| 2012/0093519 A1 | 4/2012 | Lipson et al. |
| 2012/0189239 A1 | 7/2012 | Tu et al. |
| 2012/0207424 A1 * | 8/2012 | Zheng .................. G02B 6/1228 385/2 |
| 2012/0213531 A1 | 8/2012 | Nazarathy et al. |

(56) References Cited

U.S. PATENT DOCUMENTS

| | | | |
|---|---|---|---|
| 2012/0219250 A1* | 8/2012 | Ren | G02B 6/136 385/14 |
| 2012/0243826 A1* | 9/2012 | Sun | G02F 1/3138 385/17 |
| 2012/0300796 A1* | 11/2012 | Sysak | H01S 5/1032 372/6 |
| 2012/0328292 A1 | 12/2012 | Testa et al. | |
| 2013/0020556 A1 | 1/2013 | Bowers | |
| 2013/0039664 A1* | 2/2013 | Clifton | B82Y 20/00 398/200 |
| 2013/0051727 A1* | 2/2013 | Mizrahi | G02B 6/2804 385/28 |
| 2013/0051798 A1 | 2/2013 | Chen et al. | |
| 2013/0058606 A1 | 3/2013 | Thomson et al. | |
| 2013/0089340 A1 | 4/2013 | Huang et al. | |
| 2013/0094797 A1 | 4/2013 | Zheng et al. | |
| 2013/0182305 A1 | 7/2013 | Feng et al. | |
| 2013/0188902 A1 | 7/2013 | Gardes et al. | |
| 2013/0195397 A1* | 8/2013 | Kung | G02B 6/134 385/14 |
| 2013/0229701 A1* | 9/2013 | Feng | G02F 1/0147 359/278 |
| 2013/0243374 A1* | 9/2013 | Watanabe | G02B 6/125 385/24 |
| 2013/0259483 A1 | 10/2013 | McLaren et al. | |
| 2013/0279845 A1* | 10/2013 | Kobrinsky | G02B 6/12004 385/14 |
| 2013/0285184 A1* | 10/2013 | Li | H01L 31/02325 257/432 |
| 2013/0315599 A1 | 11/2013 | Lam et al. | |
| 2013/0321816 A1* | 12/2013 | Dattner | G01J 3/4531 356/451 |
| 2014/0061677 A1* | 3/2014 | Jakoby | G01N 21/7703 257/80 |
| 2014/0111793 A1* | 4/2014 | Asghari | G01J 1/0425 356/73 |
| 2014/0140655 A1* | 5/2014 | Chakravarty | B82Y 20/00 385/12 |
| 2014/0161457 A1 | 6/2014 | Ho et al. | |
| 2014/0226976 A1 | 8/2014 | Britz et al. | |
| 2014/0270618 A1* | 9/2014 | Dinu | H01S 5/14 385/3 |
| 2014/0286647 A1* | 9/2014 | Ayazi | G02F 1/2255 398/139 |
| 2014/0307300 A1 | 10/2014 | Yang et al. | |
| 2014/0307997 A1* | 10/2014 | Bar | H01L 21/8252 385/14 |
| 2014/0334768 A1* | 11/2014 | Chang | G02B 6/4212 385/14 |
| 2014/0341497 A1 | 11/2014 | Liu et al. | |
| 2014/0341498 A1 | 11/2014 | Manouvrier | |
| 2015/0010307 A1 | 1/2015 | Zhong et al. | |
| 2015/0071651 A1 | 3/2015 | Asmanis et al. | |
| 2015/0098676 A1* | 4/2015 | Krasulick | H01S 5/02326 385/14 |
| 2015/0125111 A1* | 5/2015 | Orcutt | G02F 1/025 385/14 |
| 2015/0162182 A1 | 6/2015 | Edmonds et al. | |
| 2015/0212268 A1* | 7/2015 | Goodwill | G02B 6/124 385/14 |
| 2015/0270684 A1* | 9/2015 | Suzuki | H01S 5/1237 372/45.012 |
| 2015/0293384 A1 | 10/2015 | Ogawa et al. | |
| 2015/0316793 A1* | 11/2015 | Ayazi | G02F 1/2257 385/3 |
| 2015/0346520 A1 | 12/2015 | Lee et al. | |
| 2015/0362764 A1* | 12/2015 | Cunningham | G02F 1/025 385/2 |
| 2015/0373433 A1 | 12/2015 | McLaren et al. | |
| 2016/0043262 A1* | 2/2016 | Okumura | H01L 31/028 257/184 |
| 2016/0103382 A1 | 4/2016 | Liboiron-Ladouceur et al. | |
| 2016/0109731 A1* | 4/2016 | Huang | G02F 1/025 385/3 |
| 2016/0211645 A1* | 7/2016 | Padullaparthi | H01S 5/02251 |
| 2016/0211921 A1 | 7/2016 | Welch et al. | |
| 2016/0218811 A1 | 7/2016 | Chen et al. | |
| 2016/0266337 A1* | 9/2016 | Feng | G02B 6/10 |
| 2016/0290891 A1* | 10/2016 | Feng | H01L 22/10 |
| 2016/0358954 A1* | 12/2016 | Hoyos | H01L 29/945 |
| 2016/0365929 A1 | 12/2016 | Nakamura et al. | |
| 2017/0023810 A1* | 1/2017 | Ogawa | G02F 1/015 |
| 2017/0082876 A1 | 3/2017 | Jones et al. | |
| 2017/0207600 A1* | 7/2017 | Klamkin | H01S 5/142 |
| 2017/0212304 A1* | 7/2017 | Sacher | G02B 6/12002 |
| 2017/0229840 A1* | 8/2017 | Lambert | G02B 6/122 |
| 2017/0250758 A1 | 8/2017 | Kikuchi | |
| 2017/0254955 A1* | 9/2017 | Poon | G02F 1/2257 |
| 2017/0255077 A1* | 9/2017 | Pruessner | G01S 7/4813 |
| 2017/0276872 A1* | 9/2017 | Nakamura | G02B 6/125 |
| 2017/0288781 A1 | 10/2017 | Carpentier et al. | |
| 2017/0299902 A1* | 10/2017 | Yu | G02F 1/015 |
| 2017/0317471 A1* | 11/2017 | Lor | G02B 6/124 |
| 2018/0081118 A1* | 3/2018 | Klamkin | G02B 6/4208 |
| 2018/0101082 A1* | 4/2018 | Yu | H01L 31/1105 |
| 2018/0217469 A1* | 8/2018 | Yu | G02F 1/2257 |
| 2018/0246351 A1* | 8/2018 | Ho | G02F 1/01708 |
| 2018/0335569 A1 | 11/2018 | Saito et al. | |
| 2018/0335653 A1 | 11/2018 | Mentovich et al. | |
| 2019/0139950 A1 | 5/2019 | Yu et al. | |
| 2019/0179177 A1* | 6/2019 | Rickman | H04B 10/29 |
| 2019/0278111 A1* | 9/2019 | Yu | G02F 1/011 |
| 2019/0293971 A1* | 9/2019 | Yu | G02F 1/017 |
| 2019/0330482 A1* | 10/2019 | Williams | C09D 11/322 |
| 2019/0384003 A1* | 12/2019 | Painchaud | G02B 6/2821 |
| 2020/0124878 A1 | 4/2020 | Yu et al. | |

FOREIGN PATENT DOCUMENTS

| | | |
|---|---|---|
| CN | 102162137 A | 8/2011 |
| CN | 102713703 A | 10/2012 |
| CN | 102955265 A | 3/2013 |
| CN | 205485142 U | 8/2016 |
| EP | 0 310 058 A2 | 4/1989 |
| EP | 1 761 103 A1 | 3/2007 |
| EP | 3 046 275 A1 | 7/2016 |
| JP | 06-232384 A | 8/1994 |
| JP | 2004-163753 A | 6/2004 |
| JP | 2005-300678 A | 10/2005 |
| WO | WO 91/13375 A1 | 9/1991 |
| WO | WO 92/10782 A1 | 6/1992 |
| WO | WO 02/41663 A2 | 5/2002 |
| WO | WO 02/086575 A1 | 10/2002 |
| WO | WO 2008/024458 A2 | 2/2008 |
| WO | WO 2009/048773 A1 | 4/2009 |
| WO | WO 2011/069225 A1 | 6/2011 |
| WO | WO 2015/060820 A1 | 4/2015 |
| WO | WO 2015/155900 A1 | 10/2015 |
| WO | WO 2016/094808 A1 | 6/2016 |
| WO | WO 2016/139484 A1 | 9/2016 |
| WO | WO 2016/154764 A2 | 10/2016 |
| WO | WO 2017/135436 A1 | 8/2017 |

OTHER PUBLICATIONS

International Search Report and Written Opinion of the International Searching Authority, dated Mar. 1, 2018, corresponding to PCT/EP2017/081215, 15 pages.

International Search Report and Written Opinion of the International Searching Authority, dated Mar. 8, 2018, corresponding to PCT/EP2017/081186, 13 pages.

U.K. Intellectual Property Office Search Report, dated May 25, 2018, for Patent Application No. GB1720033.8, 3 pages.

U.K. Intellectual Property Office Search Report, dated May 30, 2018, for Patent Application No. GB1720036.1, 7 pages.

U.K. Intellectual Property Office Examination Report, dated Aug. 23, 2018, for Patent Application No. GB1720033.8, 5 pages.

(56) References Cited

OTHER PUBLICATIONS

U.K. Intellectual Property Office Search and Examination Report, dated Aug. 28, 2018, for Patent Application No. GB1720036.1, 7 pages.
U.S. Appl. No. 16/465,538, filed May 30, 2019.
"40Gb/s 2R Optical Regenerator (wavelength converter)", CIP Technologies, Preliminary Datasheet, Nov. 2013, 2 pages.
Bregni, Stefano et al., "Architectures and Performance of AWG-Based Optical Switching Nodes for IP Networks", IEEE Journal on Selected Areas in Communications, Sep. 2003, pp. 1113-1121, vol. 21, No. 7.
Chinese Notification of the First Office Action and Search Report, for Patent Application No. 201580009961.1, dated Sep. 5, 2018, 8 pages.
Chinese Notification of the First Office Action, for Patent Application No. 201710650505.6, dated Mar. 21, 2019, 5 pages.
Chinese Patent Office Notification of the Second Office Action, for Patent Application No. 201580009961.1, dated May 13, 2019, 5 pages.
Coldren et al. "Diode Lasers and Photonic Integrated Circuits", 2012, pp. 1-12, Second Edition, John Wiley & Sons, Inc.
Dong, Po et al., "Wavelength-tunable silicon microring modulator", Optics Express, May 10, 2010, pp. 10941-10946, vol. 18, No. 11.
Dong, Po et al., "High-speed low-voltage single-drive push-pull silicon Mach-Zehnder modulators", Optics Express, Mar. 12, 2012, pp. 6163-6169, vol. 20, No. 6.
Dubé-Demers, Raphaël et al., "Low-power DAC-less PAM-4 transmitter using a cascaded microring modulator", Optics Letters, Nov. 15, 2016, pp. 5369-5372, vol. 41, No. 22, Optical Society of America.
Durhuus, Terji et al., "All-Optical Wavelength Conversion by Semiconductor Optical Amplifiers", Journal of Lightwave Technology, Jun. 1996, pp. 942-954, vol. 14, No. 6.
Edagawa, Noboru et al., "Novel Wavelength Converter Using an Electroabsorption Modulator", IEICE Trans. Electron., Aug. 1998, pp. 1251-1257, vol. E81-C, No. 8.
Ellis, A.D. et al., "Error free 100Gbit/s wavelength conversion using grating assisted cross-gain modulation in 2mm long semiconductor amplifier", Electronics Letters, Oct. 1, 1998, pp. 1958-1959, vol. 34, No. 20.
European Patent Office Communication pursuant to Article 94(3) EPC, for Patent Application No. 15 707 725.6, dated Jun. 7, 2019, 7 pages.
Farrell, Nick, "Intel pushes photonic tech for the data center", TechRadar, Apr. 2, 2014, http://www.techradar.com/news/internet/data-centre/intel-pushes-its-photonic-tech-for-the-data-centre-1 239198, 6 pages.
Farrington, Nathan et al., "A Demonstration of Ultra-Low-Latency Data Center Optical Circuit Switching," ACM SIGCOMM Computer Communication Review, vol. 42, No. 4, 2012, pp. 95-96.
Farrington, Nathan et al., "Helios: A Hybrid Electrical/Optical Switch Architecture for Modular Data Centers", SIGCOMM'10, Aug. 30-Sep. 3, 2010, 12 Pages, New Delhi, India.
Fidaner, Onur et al., "Integrated photonic switches for nanosecond packet-switched optical wavelength conversion", Optics Express, Jan. 9, 2006, pp. 361-368, vol. 14, No. 1.
Fidaner, Onur et al., "Waveguide Electroabsorption Modulator on Si Employing Ge/SiGe Quantum Wells", Optical Society of America, 2007, 1 page.
Foster, Mark A., "Broad-band continuous-wave parametric wavelength conversion in silicon nanowaveguides", Optics Express, Sep. 24, 2007, pp. 12949-12958, vol. 15, No. 20.
Fu, Enjin et al., "Traveling Wave Electrode Design for Ultra Compact Carrier-injection HBT-based Electroabsorption Modulator in a 130nm BiCMOS Process", Proc. of SPIE, 2014, 11 pages, vol. 8989.
Geis, M.W. et al., "Silicon waveguide infrared photodiodes with >35 GHz bandwidth and phototransistors with 50 AW-1 response", Optics Express, Mar. 18, 2009, pp. 5193-5204, vol. 17, No. 7.
Gripp, Jürgen et al., "Optical Switch Fabrics for Ultra-High-Capacity IP Routers", Journal of Lightwave Technology, Nov. 2003, pp. 2839-2850, vol. 21, No. 11.
Hsu, A. et al., "Wavelength Conversion by Dual-Pump Four-Wave Mixing in an Integrated Laser Modulator", IEEE Photonics Technology Letters, Aug. 2003, pp. 1120-1122, vol. 15, No. 8.
Hu, Hao et al., "Ultra-high-speed wavelength conversion in a silicon photonic chip", Optics Express, Sep. 26, 2011, pp. 19886-19894, vol. 19, No. 21.
Hussain, Ashiq et al., "Optimization of Optical Wavelength Conversion in SOI Waveguide", Applied Mechanics and Materials, 2012, 5 pages, vol. 110-116.
International Search Report and Written Opinion of the International Searching Authority, dated Jun. 8, 2015, Mailed Jun. 15, 2015, and Received Jun. 15, 2015, Corresponding to PCT/GB2015/050523, 14 pages.
International Search Report and Written Opinion of the International Searching Authority, dated Jun. 8, 2015, Mailed Sep. 16, 2015, and Received Sep. 17, 2015, Corresponding to PCT/GB2015/050524, 18 pages.
International Search Report and Written Opinion of the International Searching Authority, dated Aug. 29, 2018, Corresponding to PCT/EP2018/062269, 15 pages.
International Search Report and Written Opinion of the International Searching Authority, dated Jun. 6, 2016, Corresponding to PCT/GB2016/050570, 13 pages.
International Search Report and Written Opinion of the International Searching Authority, dated Mar. 28, 2018, Corresponding to PCT/EP2017/083028, 14 pages.
International Search Report and Written Opinion of the International Searching Authority, dated Mar. 8, 2018, Corresponding to PCT/EP2017/080216, 14 pages.
International Search Report and Written Opinion of the International Searching Authority, dated Mar. 8, 2018, Corresponding to PCT/EP2017/080221, 13 pages.
International Search Report and Written Opinion of the International Searching Authority, dated May 26, 2017, Corresponding to PCT/IT2017/000004, 13 pages.
International Search Report and Written Opinion of the International Searching Authority, dated May 8, 2015 and Received May 11, 2015, Corresponding to PCT/GB2015/050520, 11 pages.
International Search Report and Written Opinion of the International Searching Authority, dated Sep. 11, 2017, Corresponding to PCT/GB2017/051998, 15 pages.
Kachris, Christoforos et al., "A Survey on Optical Interconnects for Data Centers", IEEE Communications Surveys & Tutorials, vol. 14, No. 4, Fourth Quarter 2012, pp. 1021-1036.
Kachris, Christoforos et al., "Optical Interconnection Networks in Data Centers: Recent Trends and Future Challenges", IEEE Communications Magazine, Optical Technologies for Data Center Networks, Sep. 2013, pp. 39-45.
Kimoto, Koji et al., "Metastable ultrathin crystal in thermally grown $SiO_2$ film on Si substrate", AIP Advances, Nov. 12, 2012, pp. 042144-1 through 042144-5, vol. 2, AIP Publishing.
Knoll, Dieter et al., "BiCMOS Silicon Photonics Platform for Fabrication of High-Bandwidth Electronic-Photonic Integrated Circuits", IEEE, 2016, pp. 46-49.
Lal, Vikrant et al., "Monolithic Wavelength Converters for High-Speed Packet-Switched Optical Networks", IEEE Journal of Selected Topics in Quantum Electronics, Jan./Feb. 2007, pp. 49-57, vol. 13, No. 1.
Leuthold, J. et al., "All-optical wavelength conversion between 10 and 100 Gb/s with SOA delayed-interference configuration", Optical and Quantum Electronics, 2001, pp. 939-952, vol. 33, Nos. 7-10.
Lever, L. et al., "Adiabatic mode coupling between SiGe photonic devices and SOI waveguides", Optics Express, Dec. 31, 2012, pp. 29500-29506, vol. 20, No. 28.
Liao, Ling et al., "High speed silicon Mach-Zehnder modulator", Optics Express, Apr. 18, 2005, pp. 3129-3135, vol. 13, No. 8.
Liu, Ansheng et al., "High-speed optical modulation based on carrier depletion in a silicon waveguide", Optics Express, Jan. 22, 2007, pp. 660-668, vol. 15, No. 2.

(56) References Cited

OTHER PUBLICATIONS

Liu, Y. et al., "Error-Free 320-Gb/s All-Optical Wavelength Conversion Using a Single Semiconductor Optical Amplifier", Journal of Lightwave Technology, Jan. 2007, pp. 103-108, vol. 25, No. 1.
Maxwell, G. et al., "WDM-enabled, 40Gb/s Hybrid Integrated All-optical Regenerator", ECOC 2005 Proceedings, 2005, pp. 15-16, vol. 6.
Meuer, Christian et al., "80 Gb/s wavelength conversion using a quantum-dot semiconductor optical amplifier and optical filtering", Optics Express, Mar. 3, 2011, pp. 5134-5142, vol. 19, No. 6.
Moerman, Ingrid et al., "A Review on Fabrication Technologies for the Monolithic Integration of Tapers with III-V Semiconductor Devices", IEEE Journal of Selected Topics in Quantum Electronics, Dec. 1997, pp. 1308-1320, vol. 3, No. 6.
Nakamura, Shigeru et al., "168-Gb/s All-Optical Wavelength Conversion With a Symmetric-Mach-Zehnder-Type Switch", IEEE Photonics Technology Letters, Oct. 2001, pp. 1091-1093, vol. 13, No. 10.
Neilson, David T., "Photonics for Switching and Routing", IEEE Journal of Selected Topics in Quantum Electronics, Jul./Aug. 2006, pp. 669-678, vol. 12, No. 4.
Ngo, Hung Q. et al, "Nonblocking WDM Switches Based on Arrayed Waveguide Grating and Limited Wavelength Conversion", Proceedings from the 23rd Conference of the IEEE Communications Society, 2004, 11 pages.
Ngo, Hung Q. et al., "Constructions and Analyses of Nonblocking WDM Switches Based on Arrayed Waveguide Grating and Limited Wavelength Conversion", IEEE/ACM Transactions on Networking, Feb. 2006, pp. 205-217, vol. 14, No. 1.
Ngo, Hung Q. et al., "Optical Switching Networks with Minimum Number of Limited Range Wavelength Converters," 24th Annual Joint Conference of the IEEE Computer and Communications Societies. Proceedings IEEE vol. 2, 2005, pp. 1128-1138.
Nishimura, Kohsuke et al., "Optical wavelength conversion by electro-absorption modulators", Active and Passive Optical Components for WDM Communications IV, Proceedings of SPIE, 2004, pp. 234-243, vol. 5595.
Partial English translation of the Chinese Notification of the First Office Action and Search Report, for Patent Application No. 201580009961.1, dated Sep. 5, 2018, 12 pages.
Partial English translation of the Chinese Patent Office Notification of the Second Office Action, for Patent Application No. 201580009961.1, dated May 13, 2019, 7 pages.
Partial English translation of the Chinese Notification of the First Office Action, for Patent Application No. 201710650505.6, dated Mar. 21, 2019, 7 pages.
Pogossian, S.P. et al., "Analysis of high-confinement SiGe/Si waveguides for silicon-based optoelectronics", J. Opt. Soc. Am. A, Mar. 1999, pp. 591-595, vol. 16, No. 3, Optical Society of America.
Proietti, Robert et al., "TONAK: A Distributed Low-latency and Scalable Optical Switch Architecture," 39th European Conference and Exhibition on Optical Communication, 2013, pp. 1005-1007.
Proietti, Roberto et al., "40 Gb/s 8x8 Low-latency Optical Switch for Data Centers," OSA/OFC/NFOEC 2011, 3 pages.
Quad 40Gb/s 2R Optical Regenerator, CIP Technologies, Preliminary Datasheet, Nov. 2013, 2 pages.
Reed, Graham T. et al., "Silicon optical modulators", Materials Today, Jan. 2005, pp. 40-50, vol. 8, No. 1.
RefractiveIndex.INFO, Refractive index database, https://RefractiveIndex.Info, 2015, 2 pages.
Roelkens, Gunther et al., "III-V-on-Silicon Photonic Devices for Optical Communication and Sensing", Photonics, 2015, 29 pages, vol. 2, No. 3.
Rouifed, Mohamed-Saïd et al., "Advances Toward Ge/SiGe Quantum-Well Waveguide Modulators at 1.3μm", IEEE Journal of Selected Topics in Quantum Electronics, Jul./Aug. 2014, 7 pages, vol. 20, No. 4.
RP Photonics Encyclopedia, Refractive Index, 2015, 3 pages, RP Photonics Consulting GmbH.
Segawa, Toru et al., "All-optical wavelength-routing switch with monolithically integrated filter-free tunable wavelength converters and an AWG", Optics Express, Feb. 17, 2010, pp. 4340-4345, vol. 18, No. 5.
Stamatiadis, C. et al., "Fabrication and experimental demonstration of the first 160 Gb/s hybrid silicon-on-insulator integrated all-optical wavelength converter", Optics Express, Feb. 1, 2012, pp. 3825-3831, vol. 20, No. 4.
Stamatiadis, Christos et al., "Photonic Provisioning Using a Packaged SOI Hybrid All-Optical Wavelength Converter in a Meshed Optical Network Testbed", Journal of Lightwave Technology, Sep. 15, 2012, pp. 2941-2947, vol. 30, No. 18.
Stubkjaer, Kristian E., "Semiconductor Optical Amplifier-Based All-Optical Gates for High-Speed Optical Processing", IEEE Journal on Selected Topics in Quantum Electronics, Nov./Dec. 2000, pp. 1428-1435, vol. 6, No. 6.
Summers, Joseph A. et al., "Monolithically Integrated Multi-Stage All-Optical 10Gbps Push-Pull Wavelength Converter", Optical Fiber Communication Conference, 2007, 3 pages, Anaheim, CA, USA.
Sysak, M.N. et al., "Broadband return-to-zero wavelength conversion and signal regeneration using a monolithically integrated, photocurrent-driven wavelength converter", Electronics Letters, Dec. 7, 2006, 2 pages, vol. 42, No. 25.
Tauke-Pedretti, Anna et al., "Separate Absorption and Modulation Mach-Zehnder Wavelength Converter", Journal of Lightwave Technology, 2008, pp. 1-8, vol. 26, No. 1.
Turner-Foster, Amy C. et al., "Frequency conversion over two-thirds of an octave in silicon nanowaveguides", Optics Express, Jan. 15, 2010, pp. 1904-1908, vol. 18, No. 3.
U.K. Intellectual Property Office Examination Report, dated Apr. 12, 2019, for Patent Application No. GB1703716.9, 5 pages.
U.K. Intellectual Property Office Examination Report, dated Aug. 10, 2017, for Patent Application No. GB1420064.6, 5 pages.
U.K. Intellectual Property Office Examination Report, dated Aug. 20, 2018, for Patent Application No. GB 1711525.4, 4 pages.
U.K. Intellectual Property Office Examination Report, dated Mar. 21, 2018, for Patent Application No. GB 1420064.6, 3 pages.
U.K. Intellectual Property Office Search and Examination Report, dated Apr. 20, 2017, Received Apr. 24, 2017, for Patent Application No. GB 1703716.9, 7 pages.
U.K. Intellectual Property Office Search and Examination Report, dated Mar. 13, 2018, for Patent Application No. GB1800519.9, 9 pages.
U.K. Intellectual Property Office Search and Examination Report, dated Sep. 12, 2017, Received Sep. 15, 2017, for Patent Application No. GB1711525.4, 5 pages.
U.K. Intellectual Property Office Search Report, dated Aug. 6, 2014, Received Aug. 8, 2014, for Patent Application No. GB1403191.8, 5 pages.
U.K. Intellectual Property Office Search Report, dated Jul. 13, 2017, for Patent Application No. GB1706331.4, 3 pages.
U.K. Intellectual Property Office Search Report, dated Jun. 10, 2015, Received Jun. 12, 2015, for Patent Application No. GB1420063.8, 4 pages.
U.K. Intellectual Property Office Search Report, dated Jun. 4, 2015, Received Jun. 8, 2015, for Patent Application No. GB1420064.6, 5 pages.
U.K. Intellectual Property Office Search Report, dated Sep. 19, 2017, for Patent Application No. GB1704739.0, 4 pages.
U.K. Intellectual Property Office Search Report, dated Sep. 5, 2014, Received Sep. 10, 2014, for Patent Application No. GB1403191.8, 2 pages.
U.K. Intellectual Property Office Examination Report, dated Dec. 2, 2015, for Patent Application No. GB 1403191.8, 3 pages.
U.K. Intellectual Property Office Examination Report, dated Oct. 20, 2015, for GB 1420063.8, 3 pages.
U.S. Office Action from U.S. Appl. No. 14/629,922 dated Nov. 25, 2015, 13 pages.
U.S. Office Action from U.S. Appl. No. 14/629,922, dated May 11, 2016, 14 pages.
U.S. Office Action from U.S. Appl. No. 15/120,861, dated Apr. 25, 2018, 15 pages.

(56) References Cited

OTHER PUBLICATIONS

U.S. Office Action from U.S. Appl. No. 15/120,861, dated Aug. 10, 2018, 20 pages.
U.S. Office Action from U.S. Appl. No. 15/120,861, dated Nov. 17, 2017, 22 pages.
U.S. Office Action from U.S. Appl. No. 15/256,321, dated Oct. 31, 2016, 24 pages.
U.S. Office Action from U.S. Appl. No. 15/369,804 dated Jul. 6, 2017, 14 pages.
U.S. Office Action from U.S. Appl. No. 15/430,314, dated Jan. 29, 2018, 26 pages.
U.S. Office Action from U.S. Appl. No. 15/555,431, dated Apr. 6, 2018, 11 pages.
U.S. Office Action from U.S. Appl. No. 15/927,943, dated Jun. 15, 2018, 13 pages.
U.S. Office Action from U.S. Appl. No. 16/195,774, dated Aug. 20, 2019, 38 pages.
U.S. Office Action from U.S. Appl. No. 16/195,774, dated Apr. 20, 2020, 41 pages.
U.S. Office Action from U.S. Appl. No. 16/195,774, dated Oct. 9, 2020, 30 pages.
U.S. Office Action from U.S. Appl. No. 16/231,257, dated Oct. 24, 2019, 8 pages.
U.S. Office Action from U.S. Appl. No. 16/275,157, dated Sep. 6, 2019, 13 pages.
U.S. Office Action from U.S. Appl. No. 16/275,157, dated Feb. 21, 2020, 14 pages.
U.S. Office Action from U.S. Appl. No. 16/420,096, dated Jan. 17, 2020, 11 pages.
U.S. Office Action from U.S. Appl. No. 16/420,096, dated Jul. 28, 2020, 10 pages.
U.S. Office Action from U.S. Appl. No. 16/550,141, dated Jul. 16, 2020, 12 pages.
Vivien, L. et al., "High speed silicon modulators and detectors", ACP Technical Digest, Communications and Photonics Conference, Nov. 7, 2012, 3 pages.
Vivien, Laurent et al., "High speed and high responsivity germanium photodetector integrated in a Silicon-On-Insulator microwaveguide", Optics Express, Jul. 23, 2007, pp. 9843-9848, vol. 15, No. 15.
Vlachos, Kyriakos et al., "Photonics in switching: enabling technologies and subsystem design", Journal of Optical Networking, May 2009, pp. 404-428, vol. 8, No. 5.
Wang, J. et al., "Evanescent-Coupled Ge p-i-n Photodetectors on Si-Waveguide With SEG-Ge and Comparative Study of Lateral and Vertical p-i-n Configurations", IEEE Electron Device Letters, May 2008, pp. 445-448, vol. 29, No. 5.
Website: "Cladding (fiber optics)", Wikipedia, 2012, http://en.wikipedia.org/w/index.php?title=Cladding_(fiber_optics)&oldid=508909143, 1 page.
Website: "Epitaxy", Wikipedia, 2015, https://en.wikipedia.org/w/index.php?title=Epitaxy&oldid=686946039, 6 pages.
Website: "Intel primes market for silicon photonics to lift data centre interconnect speeds", The Inquirer, http://www.theinquirer.net/inquirer/news/234 5 61 O/intel-primes-market-for silicon-photonics-to-lift-data-centre-interconnect-speeds, printed Jan. 18, 2017, 8 pages.
Website: "Silicon dioxide", Wikipedia, 2013, http://web.archive.org/web/20130423194808/https://en.wikipedia.org/wiki/Silicon_dioxide, printed Aug. 14, 2019, 13 pages.
Website: "Silicon on insulator", Wikipedia, 2015, https://en.wikipedia.org/w/index.php?title=Silicon_on_insulator&oldid=670386829, 5 pages.
Xi, Kang et al., "Petabit Optical Switch for Data Center Networks," Polytechnic Institute of New York University, Brooklyn, New York, 9 pages, 2010.
Yao, Shun et al., "A Unified Study of Contention-Resolution Schemes in Optical Packet-Switched Networks", Journal of Lightwave Technology, 2003, 31 pages, vol. 21, No. 3.
Ye, Tong et al., "A Study of Modular AWGs for Large-Scale Optical Switching Systems," Journal of Lightwave Technology, vol. 30, No. 13, Jul. 1, 2012, pp. 2125-2133.
Ye, Tong et al., "AWG-based Non-blocking Clos Networks", Aug. 21, 2013, pp. 1-13.

\* cited by examiner

WAVEGUIDE OPTOELECTRONIC DEVICE

CROSS-REFERENCE TO RELATED APPLICATION(S)

This application is a national stage entry, under 35 U.S.C. § 371, of International Application Number PCT/EP2017/081186, filed on Dec. 1, 2017, which claims priority to and the benefit of U.S. Provisional Patent Application No. 62/429,701, filed Dec. 2, 2016. The entire contents of all of the applications identified in this paragraph are incorporated herein by reference.

FIELD

One or more aspects of embodiments according to the present invention relate to an optoelectronic device, and more particularly to an optoelectronic device suitable for use with silicon rib waveguides.

BACKGROUND

The ability of silicon photonic systems to provide improvements upon silicon based microelectronics has long been recognized. Advances in silicon photonics underpin the success of such systems and there is an ever increasing desire in particular for faster, more efficient optical modulators and photodetectors that are compatible with silicon photonic systems. Electro-absorption modulators (EAMs) including SiGe material have been found to deliver state of the art high-speed performance since the presence of germanium gives more freedom to optimize the device. However, when it comes to processing and manufacturing, meeting the slab tolerance requirements for a SiGe based waveguide modulator in large waveguide platform is challenging, particularly as a result of the fact that the waveguide height to slab thickness ratio is large.

SUMMARY

Accordingly, the present invention aims to solve the above problems by providing, according to a first aspect of embodiments, a waveguide optoelectronic device, comprising a rib waveguide region, the rib waveguide region having: a silicon base, and a ridge extending from the base, at least a portion of the ridge being formed from an semiconductor material which is different from the base; wherein the silicon base includes a first slab region at a first side of the ridge and a second slab region at a second side of the ridge; and wherein: a first doped region extends along: the first slab region and along a first sidewall of the ridge, the first sidewall contacting the first slab region; and a second doped region extends along: the second slab region and along a second sidewall of the ridge, the second sidewall contacting the second slab region. The optoelectronic device may be a modulator or a photodetector. If the optoelectronic device is a modulator, the waveguide ridge region may be referred to as a waveguide modulation ridge region. The term 'rib' may be used interchangeably with the term 'ridge', where what may generally be meant is that an optical mode of the rib waveguide device is chiefly confined within the ridge region of the waveguide. The portion of the rib may be a horizontal portion or a horizontal layer i.e. a portion of the rib which extends in a direction parallel to an uppermost surface of the slab.

The semiconductor material of the ridge may be silicon germanium. However, other semiconductor materials may also be used, in particular materials. It is also envisaged that the material of the ridge may take the form of metal alloys of silicon, germanium or SiGe. For example, a GeSn or SiGeSn alloy grown on Si.

In this way, the slab contact for applying a voltage across the semiconductor junction can be in silicon. Typically, contacts for applying a bias across a waveguide device will be made from a metal. Since the series resistance of silicon is lower than other materials (such as SiGe), a metal/silicon interface at the contact point will provide a better contact resistance than would be provided, for example, at a metal SiGe interface. By producing an optoelectronic device structure with at least a portion of the ridge being formed from a different material from the base, the resulting structure maintains the advantages associated with the chosen ridge material, whilst also enjoying the advantages provided by a silicon base layer.

In this invention, meeting silicon slab tolerance requirements in terms of processing is easier and more relaxed as compared to where the slab is formed of SiGe. The structure of the present invention therefore provides the advantages associated with SiGe waveguide EAMs whilst solving the above mentioned problems with slab tolerance requirements.

Optional features of the invention will now be set out. These are applicable singly or in any combination with any aspect of the invention.

Optionally, the waveguide electro-absorption modulator or photodiode further comprises: a first electrical contact located on the first slab region of the silicon base; and a second electrical contact located on the second slab region of the silicon base.

Optionally, the first doped region is n doped and the second doped region is p doped.

Optionally, the ridge comprises: a lower ridge portion in contact with and extending away from the base; the base and lower ridge portion both being formed from silicon; and an upper ridge portion in contact with and extending away from the lower ridge portion, the upper ridge portion being formed from the semiconductor material which is different from that of the base; wherein the first doped region which extends along the first sidewall includes a lower sidewall portion located at the first ridge portion and an upper sidewall region located at the second ridge portion; and the second doped region which extends along the second sidewall includes a lower sidewall portion located at the first ridge portion and an upper sidewall region located at the second ridge portion.

In this way, the ridge (i.e. the rib section of the EAM waveguide) will also include a portion made from the base material (in this case silicon). This advantageously optimizes the optical mode overlap between the waveguide device and the input (and output) passive silicon waveguides which couple light into and out of the waveguide device, thereby improving overall loss.

In addition, the present invention enables the height of the chosen semiconductor material of the ridge to be varied without necessarily varying the height of the overall ridge (since some of the ridge is made up of the material used for the base rather than being made up of the chosen semiconductor material). In embodiments where the chosen semiconductor material is SiGe, this can advantageously lead to the production of waveguide devices with a higher bandwidth. This is because the capacitance of the device depends upon the height of the SiGe region. By enabling the SiGe region to be reduced in height, the capacitance can be lowered, and the bandwidth can therefore be increased.

Optionally, the lower sidewall portions and slab regions have a higher dopant concentration than the upper sidewall portions.

Optionally the dopant concentrations are graded such that the lower sidewall portions have a higher dopant concentration than the upper sidewall dopant concentrations; and the slab regions have higher dopant concentrations than the lower sidewall portions. For example, on the first doped region, the doped portion in the upper sidewall could be n doped; the doped portion at the lower sidewall could be n+ doped; and the doped portion at the slab could be n++ doped. The same pattern could be followed for the p doped second doped region, ranging from p++ at the slab; p+ at the lower sidewall portion; and p doped at the upper sidewall portion. By employing a graded dopant structure, the dopant levels at the contact points on the slab can be maximized without detrimentally affecting the mode of light travelling through the waveguide.

Optionally, the distance ($d_{np2}$, $d_{pp2}$) by which the first and second lower sidewall portions extend into the ridge is greater than the distance ($d_n$, $d_p$) by which the first and second upper sidewall portions extend into the ridge. That is to say, the thickness of the doped regions at the sidewalls may be thicker in the lower ridge portion as compared to in the upper ridge portion.

In this way, the series resistance (ohmic resistance) of the device is reduced which improves the overall RF bandwidth. In addition, by achieving such low series resistance (ohmic resistance) the maximum optical power handling of the device is also improved.

Optionally, the waveguide electro-absorption modulator or photodiode may further comprise: an input rib waveguide coupled to the input of the rib waveguide region to couple light into the rib waveguide region; and an output rib waveguide coupled to the output of the rib waveguide region to couple light out of the rib waveguide region.

Optionally, one or both of the input rib waveguide and output rib waveguide may be formed entirely from silicon.

Optionally, the height of the base ($h_2$) and the height of the lower sidewall portions ($h_3$) are chosen such that the mode center of the rib waveguide modulator or photodiode is located at the same height above the base as the mode center of the input and/or output rib waveguide(s).

In such embodiments, it should be understood that the height of the lower sidewall portions correspond to the distance by which they extend from the slab. The ridge extends from the base in a direction which is perpendicular or substantially perpendicular to the upper surface of the base. The base is typically formed on an insulating layer such as a buried oxide (BOX) layer (not shown), the lower surface being in contact with the insulating layer, and the upper surface being the opposing surface, i.e. that which is not in contact with the insulating layer.

The height may be thought of as extending in a vertical direction, and the upper surface of the base (and hence the upper surface of each of the first slab and second slab) as lying in a horizontal plane, that is to say, any plane parallel to the insulating layer upon which the base is located.

The device may further comprise an epitaxial crystalline cladding layer disposed between the silicon base and a silicon substrate; wherein the silicon substrate is located on an opposite side of the silicon base to the ridge. The device may further comprise a buried oxide layer, disposed on opposing horizontal sides of the epitaxial crystalline cladding layer, and wherein the epitaxial crystalline cladding layer is formed of a material which is different to the buried oxide layer. By horizontal, a direction may by meant which is perpendicular to the direction in which the ridge extends. The epitaxial crystalline cladding layer may be formed of a material which is not buried oxide. The epitaxial crystalline cladding layer may be formed, for example, of Si or SiGe.

According to a second aspect of embodiments, there is provided a method of manufacturing a rib waveguide modulation region, the method comprising the steps of:

providing a layer of a first semiconductor material;

etching a cavity into the layer, the cavity having a base, a first cavity edge and a second cavity edge;

implanting the base with a first dopant to create a first doped slab region; implanting the base with a second dopant to create a second doped slab region laterally spaced from the first slab region;

growing a chosen semiconductor material within the cavity, the chosen semiconductor material being a different material from the base layer;

etching the grown chosen semiconductor material to form a chosen semiconductor material waveguide ridge which lies within the cavity and extends upwards from base and overlies a portion of the first doped slab region and a portion of the second doped slab region; the waveguide having a first sidewall which contacts the first slab doped region and a second sidewall which contacts the second doped slab region;

implanting the first sidewall with the first dopant;

implanting the second sidewall with the second dopant; and etching away the first cavity edge and the second cavity edge.

The method may typically further comprise the step of annealing after first slab region and second slab region have been implanted. The method may also typically comprise the step of annealing after first sidewall and second sidewall have been implanted.

The step of a cavity into the silicon layer may be a deep etching step, the etch having a depth of at least 2 μm.

In some embodiments, the deep etch has an etch depth which is no less than 2 μm and no more than 3 μm.

In some embodiments, the deep etch has an etch depth which is no less than 2.2 μm and no more than 2.9 μm.

Optionally, the method further comprises the step of creating a lower ridge portion made of the first semiconductor material directly underneath the waveguide ridge of the chosen semiconductor material by:

etching the doped first slab region by a height $h_3$ which is less than its total depth; and etching the doped second slab region by a height $h_3$ which is less than its total depth.

The first material and the chosen semiconductor material are typically semiconductor materials which are suitable for use within the field of optoelectronics but which have different properties to one another. In particular, the first material may be chosen such that it has a series resistance which is lower than the chosen semiconductor material. As previously described, in some embodiments, the first material is silicon and the chosen semiconductor material is SiGe. In other embodiments, the first material is silicon, and the chosen semiconductor material is germanium or a metal alloy of silicon, germanium or SiGe. For example, a GeSn alloy grown on Si or on a III-V semiconductor. In yet further embodiments, the first material is a III-V semiconductor and the chosen semiconductor material is a different III-V material.

According to a third aspect of embodiments of the present invention, there is provided a waveguide optoelectronic device, comprising a rib waveguide, the rib waveguide having: a base formed from a first material, and a ridge extending from the base, at least a portion of the ridge being formed from a second material which is different from the first material; wherein the base includes a first slab region at a first side of the ridge and a second slab region at a second side of the ridge; and wherein: a first doped region extends along: the first slab region and along a first sidewall of the ridge, the first sidewall contacting the first slab region; and a second doped region extends along: the second slab region and along a second sidewall of ridge, the second sidewall contacting the second slab region; and wherein the ridge comprises: a lower ridge portion in contact with and extending away from the base; the base and lower ridge portion both being formed from the first material; and an upper ridge portion in contact with and extending away from the lower ridge portion, the upper ridge portion being formed from the second material.

The first and second material are typically first and second semiconductor materials which are suitable for use within the field of optoelectronics. In some embodiments, the first semiconductor material has a series resistance which is lower than that of the second material. As previously described, in some embodiments, the first material is silicon and the second material is SiGe. In other embodiments, the first material is silicon, and the second material is a metal alloy of silicon, germanium or SiGe. For example, the second material may be a SiGeSn or GeSn alloy grown on Si or a III-V semiconductor. In yet further embodiments, the first material is a III-V semiconductor and the second material is a different III-V material.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a waveguide optoelectronic device (EAM) and/or method of manufacturing a rib waveguide modulation region provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features. A waveguide optoelectronic device 1 according to a first embodiment of the present invention is described below with reference to FIGS. 1, 2A, 2B, 3A and 3B.

Figure 1:
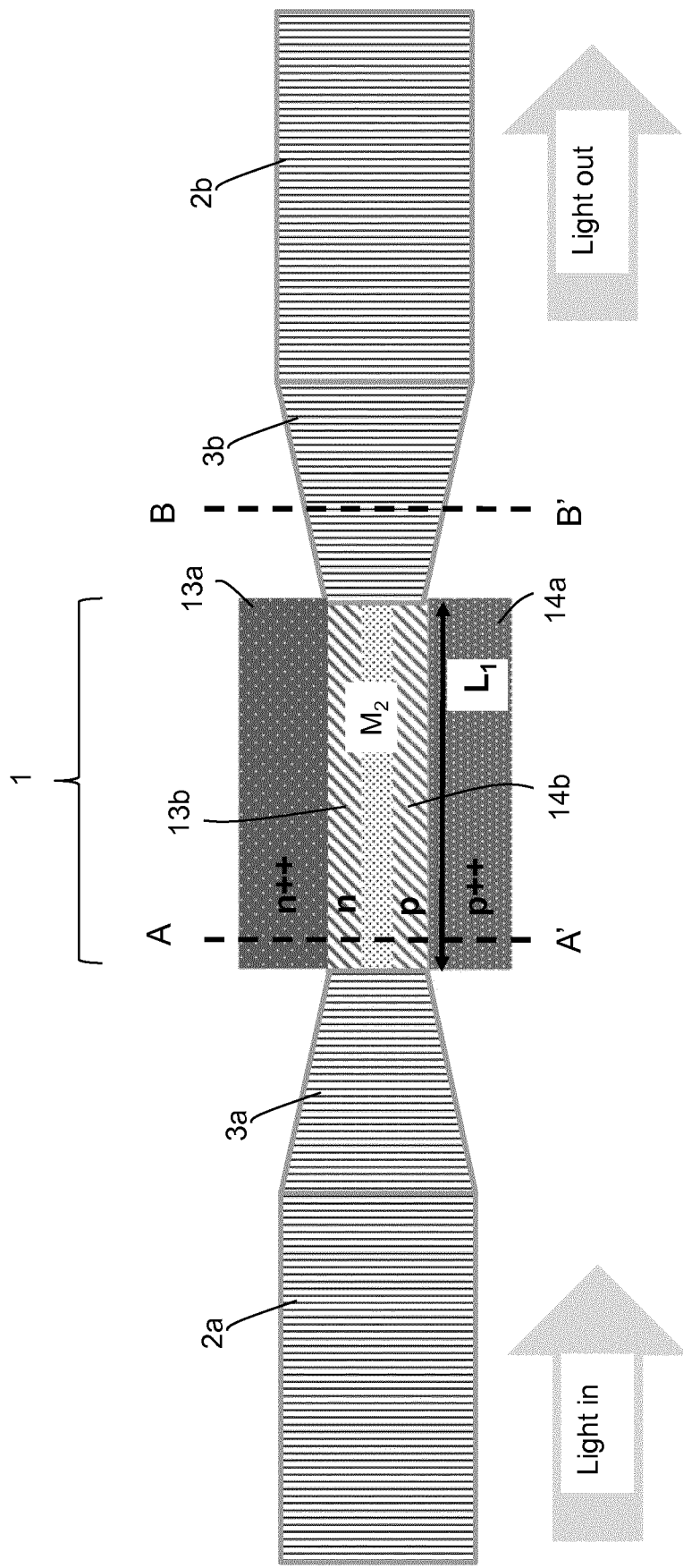
FIG. 1 depicts a schematic diagram of a waveguide device in the form of a waveguide electro-absorption modulator (EAM) according to an embodiment of the present invention.

As shown in FIG. 1, the waveguide device 1 is suitable for coupling to standard optical input and output waveguides 2*a*, 2*b* such as silicon rib waveguides. Whilst this coupling could be achieved by direct coupling between input/output waveguides and the device, in the embodiment shown, coupling is achieved by way of an input taper 3*a* and an output taper 3*b* which allows for the waveguide device to be fabricated using smaller waveguide dimensions than those of the input/output waveguides 2*a*, 2*b*, thereby resulting in faster speeds of operation.

Figure 2A:
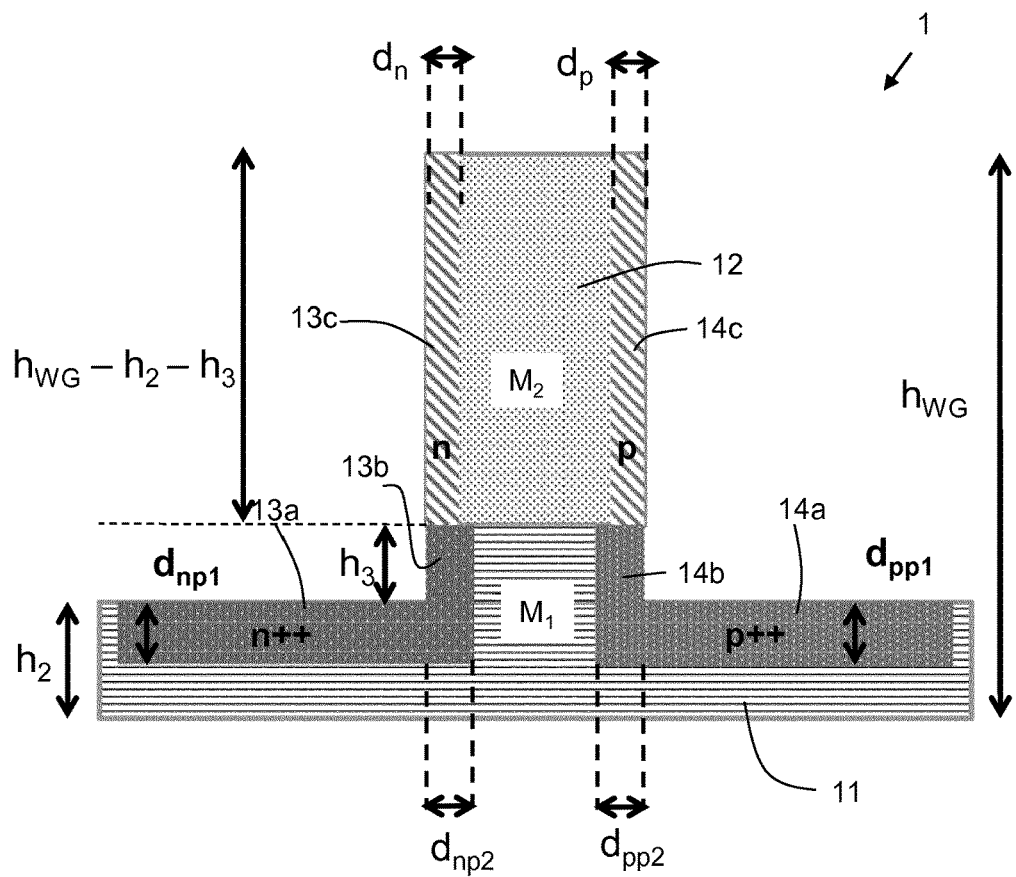
FIG. 2A depicts a cross section along the line A-A' in FIG. 1.
Figure 2B:
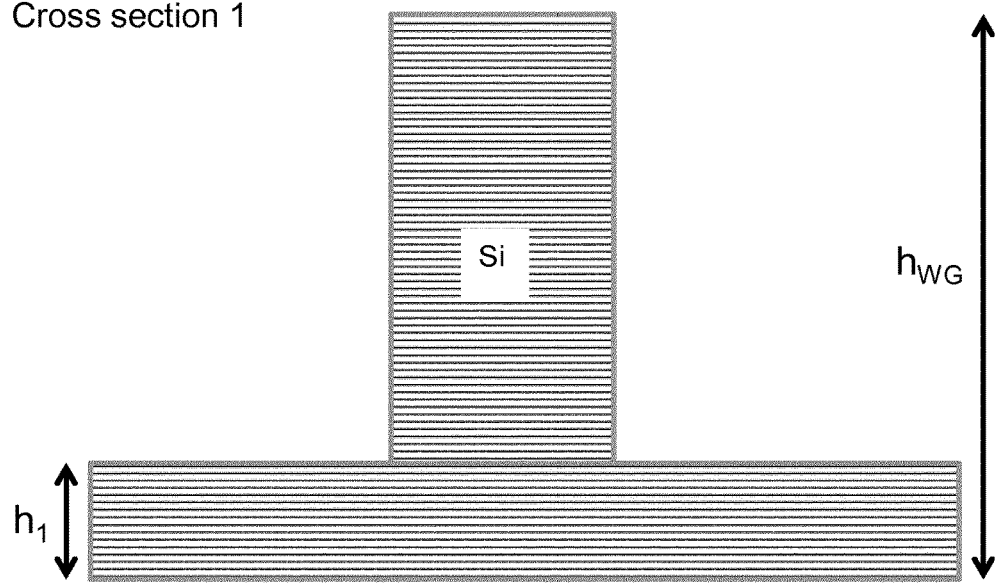
FIG. 2B depicts a cross section along the line B-B' in FIG. 1.
Figure 3A:
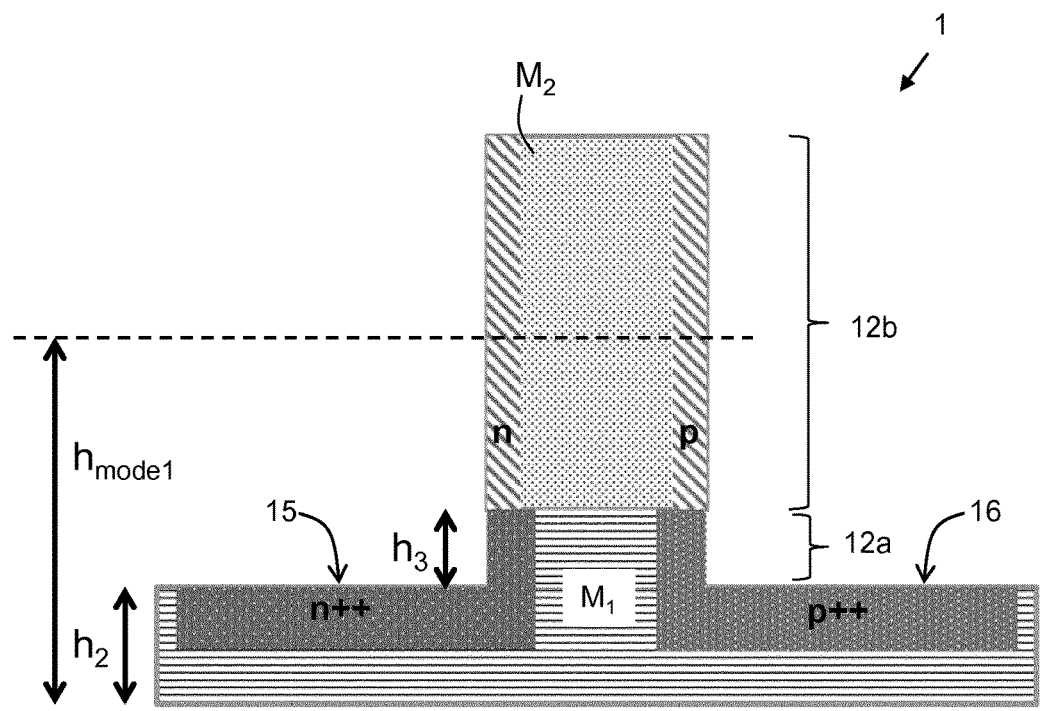
FIG. 3A depicts the cross section of FIG. 2A with an optical mode shown propagating through the waveguide.
Figure 3B:
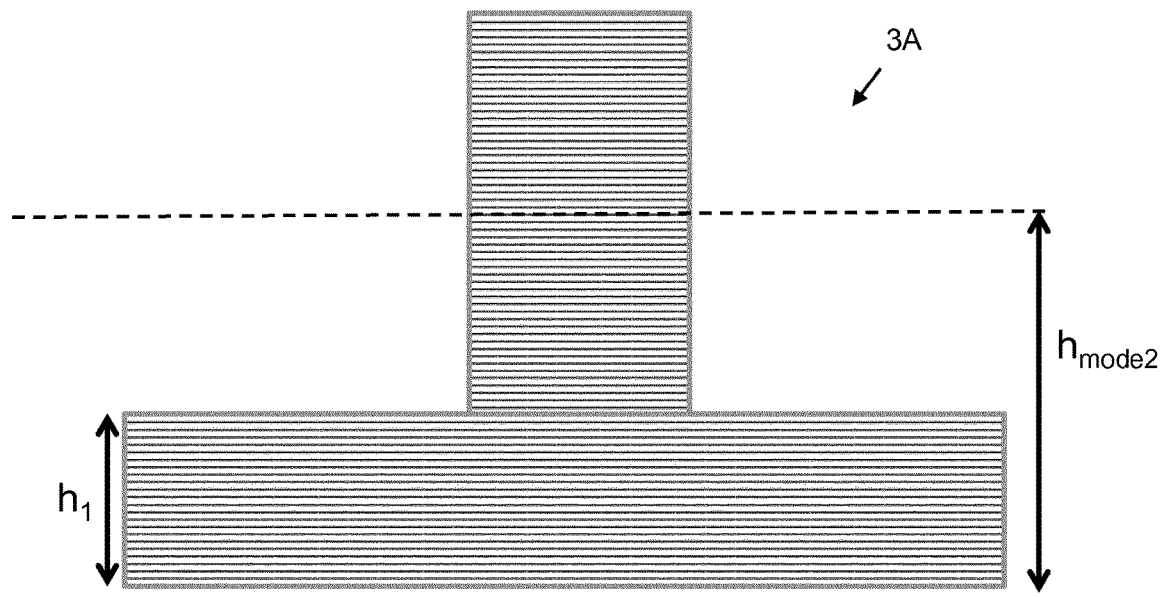
FIG. 3B depicts the cross section of FIG. 2B with an optical mode shown propagating through the waveguide.

FIG. 2A and FIG. 3A each show a cross section of the waveguide optoelectronic device taken at line A-A' of FIG. 1, that is to say, transverse to the direction of the propagation of light along the waveguides. FIG. 2B and FIG. 3B each show a cross section taken at line B-B' of FIG. 1, at the output at the taper portion 3*b* which couples to the output rib waveguide 2*b*. Again, this cross section is taken transverse to the direction of the propagation of light.

The waveguide optoelectronic device 1 comprises a ridge modulation or photodetection region with a height $h_{WG}$; the ridge modulation region being made up of a base 11 manufactured from a first waveguide material $M_1$ and a ridge 12 manufactured from a second waveguide material $M_2$ which is different from the first waveguide material.

The base 11 includes a first slab region extending away from a first sidewall of the waveguide ridge in a first direction and a second slab region extending away from a second sidewall of the waveguide ridge in a second direction; the second direction being opposite from the first direction.

The waveguide optoelectronic device includes a first doped region, the first doped region including a first doped slab region 13a and a first doped sidewall region extending along the first sidewall of the waveguide.

In the embodiment shown in FIG. 2A and FIG. 3A, the ridge of the waveguide is formed from a lower ridge portion 12a and an upper ridge portion 12b. The lower ridge portion is in contact with and extends away from the base; the base and lower ridge portion both being formed from the first material $M_1$. The upper ridge portion is made from the second material $M_2$ located on top of the lower ridge portion in that it is in contact with and extends away from the lower ridge portion.

The first doped sidewall region extends along the entire sidewall of the ridge including both the lower ridge portion 12a and the upper ridge portion 12b. The first doped sidewall region therefore comprises a first lower sidewall portion 13b which extends along the first sidewall at the lower ridge portion of the ridge; and a first upper sidewall portion 13c which extends along the sidewall at the upper ridge portion of the ridge.

Similarly, at the second side of the rib waveguide, the waveguide optoelectronic device comprises a second doped slab region 14a and a second doped sidewall region extending along the second sidewall of the waveguide. The second doped sidewall is made up of a second lower sidewall portion 14b which extends along the second sidewall at the lower ridge portion of the ridge; and a second upper sidewall portion 14c which extends along the sidewall at the upper ridge portion of the ridge.

The dopant concentration at the doped slab regions and the lower doped sidewall regions are higher than those of the upper doped sidewall regions. In the embodiment shown in FIGS. 2A and 3A, the first doped slab region and first lower sidewall doped region are n++ doped whilst the first upper sidewall is n doped; the n++ dopant region typically containing at least one-two orders of magnitude more dopant per $cm^3$ as compared to the n doped region. The second doped slab region and second lower sidewall doped region are p++ doped whilst the second upper sidewall is p doped.

In this embodiment of FIGS. 2A and 3A, the first material $M_1$ is formed from silicon, Si and the second material $M_2$ is silicon germanium (SiGe). However, as described above, it is envisaged that the structure of this embodiment could equally be applied to other suitable optical materials. Examples of suitable dopant concentrations for an $M_1/M_2$ structure of Si/SiGe are shown in Table 1 below.

TABLE 1

| Doping type | Doping range [1/cm$^3$] |
| --- | --- |
| n | 1e15-1e18 |
| p | 1e15-1e18 |
| n++ | 1e18-1e20 |
| p++ | 1e18-1e20 |

As can be seen in FIG. 2A, the first doped slab region can be defined by a thickness $d_{np1}$ by which it extends downwards into the slabs of the first material $M_1$. The first lower sidewall portion 13b and second lower sidewall portion 14b each extend upwardly away from the slab by a height $h_3$ which corresponds to the height of the lower portion of the ridge. These lower sidewall portions 13b, 14b extend into the ridge by respective distance $d_{np2}$, $d_{pp2}$, each of these respective distances being less than half the total cross sectional width of the lower ridge portion, such that an undoped region separates the n++ region from the p++ region thereby forming a p-i-n junction.

An electrical contact (not shown) will be located at each of the slab regions in order to apply a bias across the junction which is formed by the doped regions. These electrical contacts will be located directly onto the slab (i.e. at the upper surface of the slab, on either side of the ridge). Typically the contacts may be equidistant from the respective sidewalls of the ridge.

The first and second upper sidewall portions 13c, 14c extend into the upper ridge portion of the ridge by a distance $d_n$, $d_p$ each of which is less than the respective distances $d_{np2}$, $d_{pp2}$, by which the lower sidewall portions 13b, 14b each extend into the lower portion 12a of the rib waveguide. Examples of typical measurements are given (in nm) in Table 2.

TABLE 2

| Geometry | Tolerance |
| --- | --- |
| $h_1$ [nm] | 100-800 |
| $h_2$ [nm] | 100-400 |
| $h_3$ [nm] | 0-400 |
| $d_{np1}$, $d_{np2}$ [nm] | 50-300 |
| $d_{pp1}$, $d_{pp2}$ [nm] | 50-300 |
| $d_p$ [nm] | 50-300 |
| $d_n$ [nm] | 50-300 |

In this embodiment, the waveguide device takes the form of a waveguide electro-absorption modulator (EAM). However, it is envisaged that the device could instead take the form of another optoelectronic component such as a waveguide photodiode (PD).

Referring in particular to FIG. 3A and FIG. 3B, the parameters of the device are chosen such that the optical mode within the rib waveguide of the device 1 matches up with the optical mode propagating through the input waveguide and any input coupler such as a taper. In particular, it is the height of the mode in the ridge of the device $h_{mode1}$ relative to the base of the device which matches up to the height of the mode $h_{mode2}$ above the base of the input waveguide or taper. Typically, the optoelectronic device, the input/output waveguides, and any coupler, will be located within the same plane (i.e. the bottom surface of the base of the optoelectronic device will be level with the bottom surface of the base of the input/output waveguides). For example, the optoelectronic device, input/output waveguides and couplers may all be fabricated upon a planar insulating layer such as a buried oxide (BOX) layer (not shown).

Referring to FIGS. 4A to 4K, an example is described of a method of manufacturing a rib waveguide modulation region according to the present invention.

Initially, a layer 401 of a first semiconductor material $M_1$ is provided; the layer having an upper surface 401a and a lower surface (corresponding to the bottom surface of the base of the optoelectronic device) 401b. In some embodiments, this base layer of the initial semiconductor layer will be located upon an insulator layer such as a BOX layer. Typically, the first material will be silicon, but it is envisaged that the method described herein could be applied to other materials suitable for use with optoelectronic components such as metal alloys of silicon.

The upper surface 401a of the initial layer of the first material is etched down to a given height ($h_2+h_3$) above the bottom of the layer 401b, the etching process therefore resulting in a cavity 402 located within the initial layer of the first material 401. The cavity formed by the etching process will have a base 402a; a first cavity edge 402b; and a second cavity edge 402c.

Once the cavity 402 has been created, a photoresist 403 is deposited onto the first material $M_1$ covering all but a portion of the base of the cavity, the uncovered portion of the base 402a extending from the first cavity edge 402b to less than half way across the total length of the base of the cavity. The base of the cavity will ultimately become the first and second slabs of the optoelectronic device.

An implantation step is then carried out on the uncovered portion of the base of the cavity 402a to implant the uncovered portion with a first dopant, in this case an n type dopant to create a first slab doped portion 13a. In this case, the doped portion has a dopant concentration which may lie within the range of 1e18-1e20 $cm^{-3}$. Typically, the dopant is applied vertically, i.e. at a direction which is parallel or substantially parallel to the edge of the cavity.

Examples of a suitable n type dopants include: phosphorus and arsenic. An Example of a suitable p type dopant is boron.

Figure 4A:
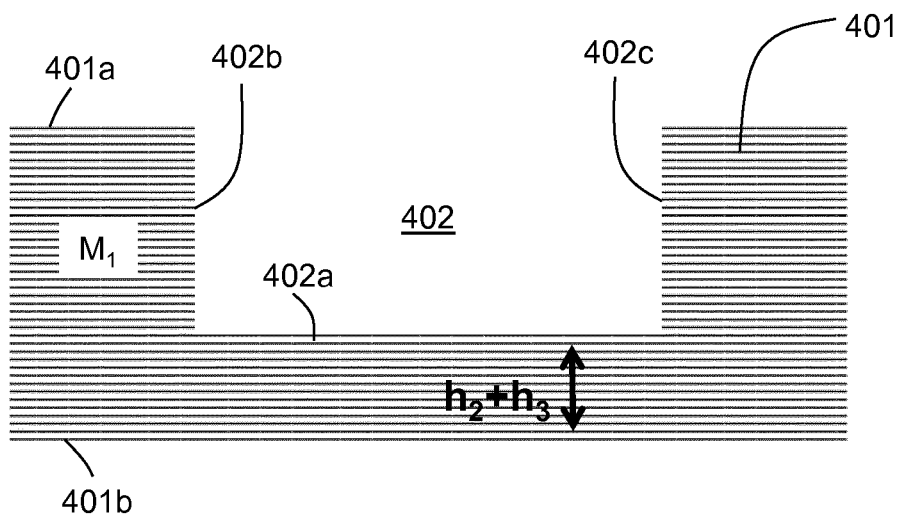
FIG. 4A depicts a cavity etching step in a method of manufacturing a rib waveguide modulation region according to an embodiment of the present invention.
Figure 4B:
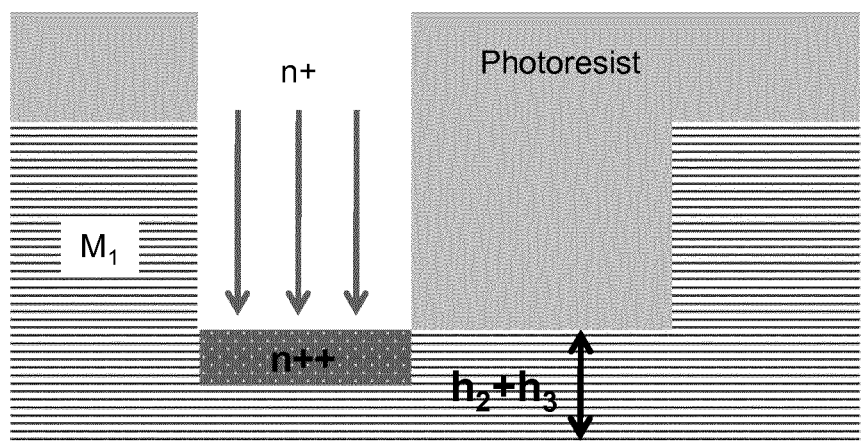
FIG. 4B depicts an implantation step in the method of manufacturing a rib waveguide modulation region.
Figure 4C:
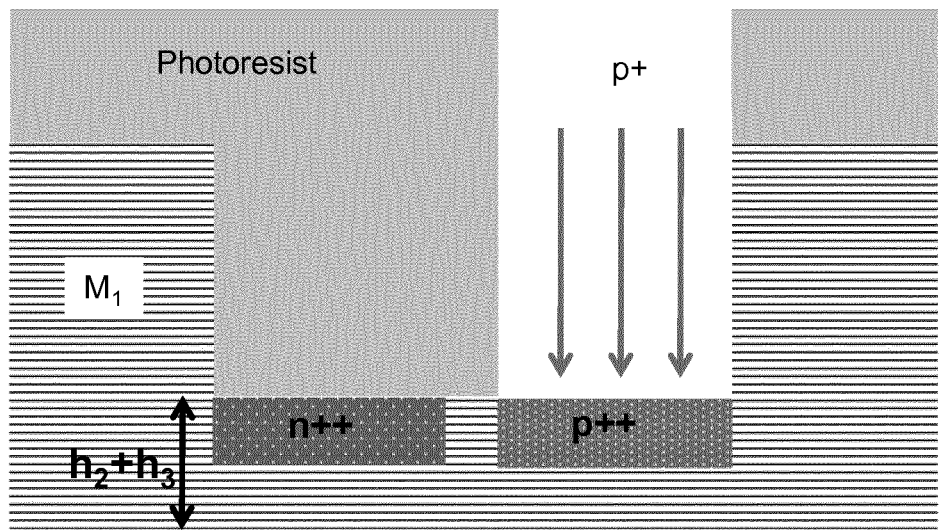
FIG. 4C depicts a further implantation step in the method of manufacturing a rib waveguide modulation region.

Once the implantation of the first slab doped portion is complete, the photoresist 403 is removed and the implantation process is repeated at the other side of the cavity to give rise to the second slab doped region as shown in FIG. 4C. Again, a photoresist 404 is deposited onto the first material $M_1$; this time covering all but a second portion of the base of the cavity, the uncovered portion of the base 402a extending from the second cavity edge 402c to less than half way across the total length of the base of the cavity such that it does not contact the already implanted n doped region. An implantation step is carried out on the uncovered second portion of the base of the cavity 402a to implant the uncovered second portion with a second dopant, in this case a p type dopant, in order to create a second slab doped portion 14a. Again, the doped portion has a dopant concentration which may lie within the range of 1e18-1e20 $cm^{-3}$. The doped portions extend by respective depths of $d_{np1}$ and $d_{pp1}$ into the base of the cavity (i.e. into the slabs of the finished device).

Figure 4D:
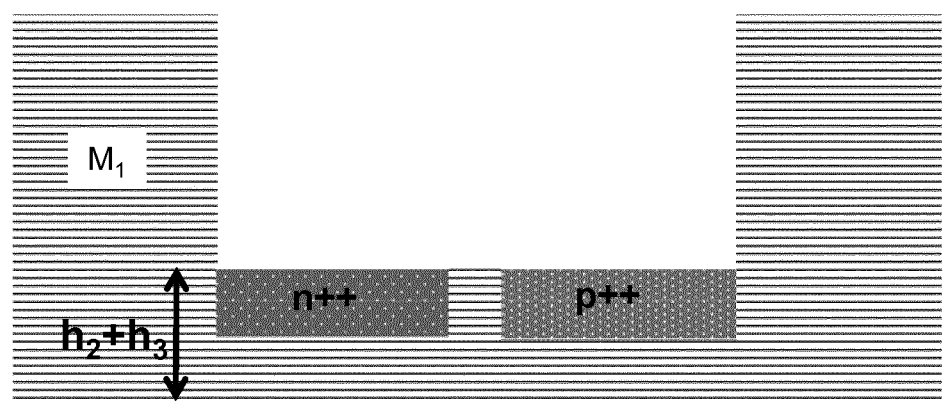
FIG. 4D depicts an annealing step in the method of manufacturing a rib waveguide modulation region.
Figure 4E:
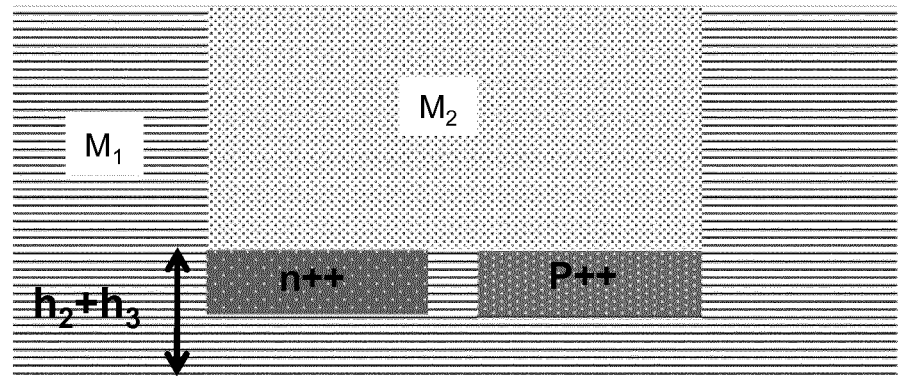
FIG. 4E depicts a SiGe growth step in the method of manufacturing a rib waveguide modulation region.

A subsequent annealing step is carried out as shown in FIG. 4D.

Following annealing, a second material $M_2$ is grown inside the cavity, the second material being different from the first material. In this embodiment, the second material $M_2$ is typically epitaxially grown Silicon Germanium (SiGe), although it is envisaged that other optically suitable materials could be used including: III-V materials and metal alloys of silicon, germanium or SiGe. The height by which the epitaxially grown layer $M_2$ extends from the base of the cavity will form the height of the upper portion of the ridge.

Figure 4F:
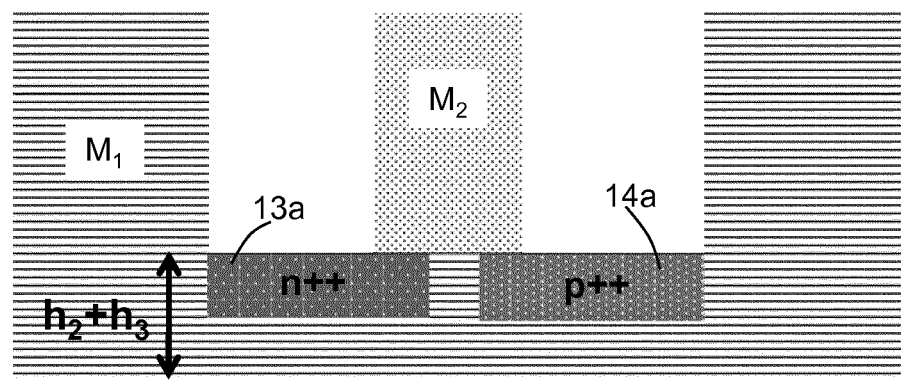
FIG. 4F depicts a further etch step in the method of manufacturing a rib waveguide modulation region.

A further etch step to create the upper ridge portion 12b is then carried out, as shown in FIG. 4F, in which a region of the second material $M_2$ is etched away above the first slab doped portion 13a and a region of the second material $M_2$ above the second slab doped portion 14a. The etching extends along the entire depth of the cavity such that uncovered doped regions are left fully exposed either side of the remaining portion of the second material $M_2$ which forms the upper ridge portion of the optoelectronic device. Note that each of the first and second slab doped portions actually extend laterally beyond the first and second side walls of the upper portion of the ridge such that the upper portion of the ridge overlays part of the first slab doped portion and also overlays part of the second doped portion.

Figure 4G:
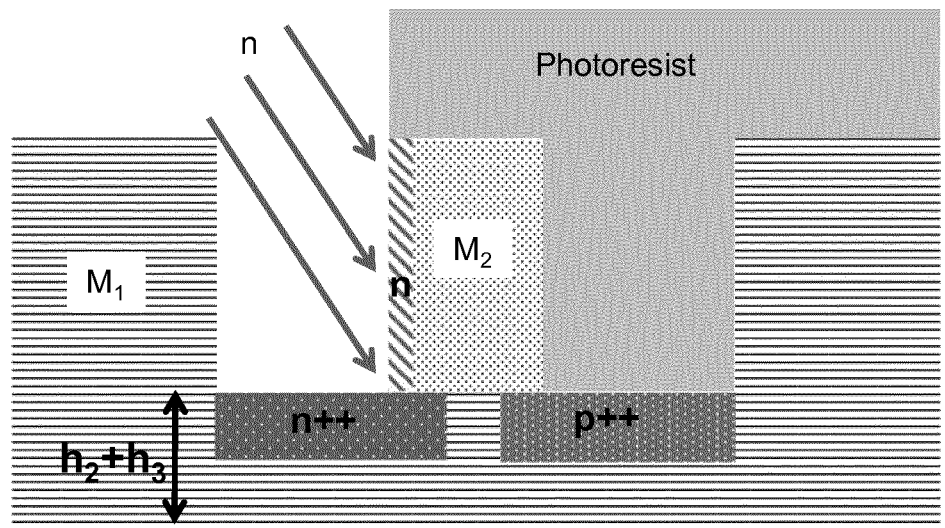
FIG. 4G depicts a sidewall implantation step in the method of manufacturing a rib waveguide modulation region.
Figure 4H:
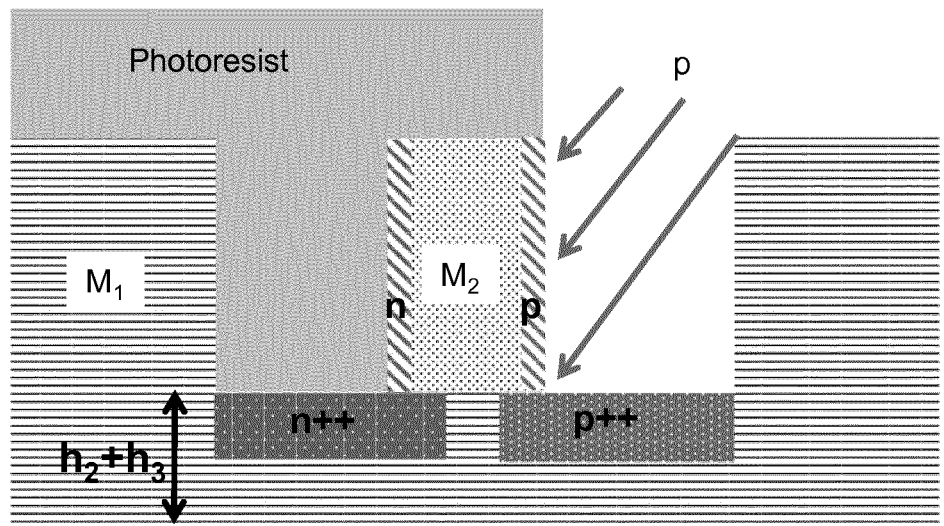
FIG. 4H depicts a further sidewall implantation step in the method of manufacturing a rib waveguide modulation region.

Once the upper ridge has been created, sidewall implantation steps are carried out to implant the first and second sidewalls 13c, 14c with n and p dopants respectively. Firstly, as shown in FIG. 4G, the first sidewall of the upper ridge 12b is doped by applying a photoresist to cover the second material $M_2$ and the second doped slab region 14a before implanting the n-type dopants at the first sidewall 13c at an angle to the sidewall. The first cavity edge 402b can be used as a shield, and the angle of implantation therefore chosen such that the edge of the cavity shields the first doped slab portion, meaning that the n dopant is applied only to the first sidewall 13c and not to the first doped slab region. As depicted in FIG. 4H, the sidewall implantation steps are then repeated for the second sidewall 14c of the ridge. Specifically, a photoresist to cover the second material $M_2$ and the first doped slab region 13a before implanting the p-type dopants at the sidewall at an angle to the sidewall is applied. The first cavity edge 402c can be used as a shield, and the angle of implantation therefore chosen such that the edge of the cavity shields the second doped slab portion, meaning that the p dopant is applied only to the second sidewall 14c and not to the second doped slab region.

Figure 4I:
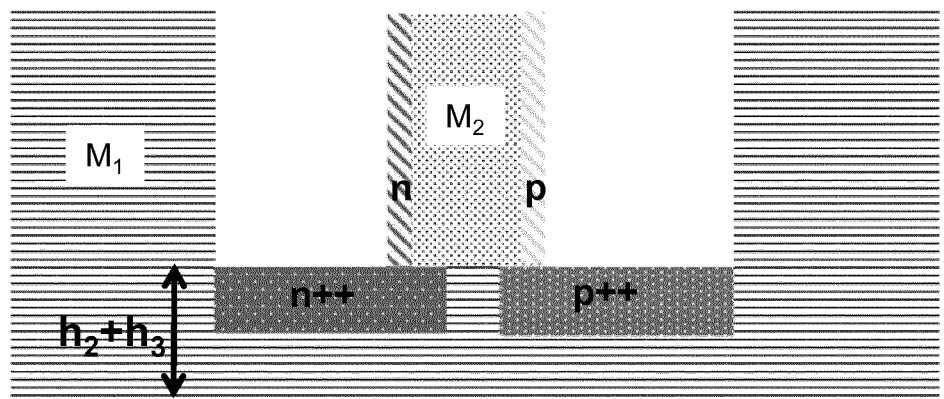
FIG. 4I depicts a further annealing step in the method of manufacturing a rib waveguide modulation region.

A further annealing step is carried out as depicted in FIG. 4I. Annealing (as shown in both FIG. 4D and FIG. 4I) may be performed at temperatures of 450-800° C. and for a typical duration of 30 minutes or less.

Figure 4J:
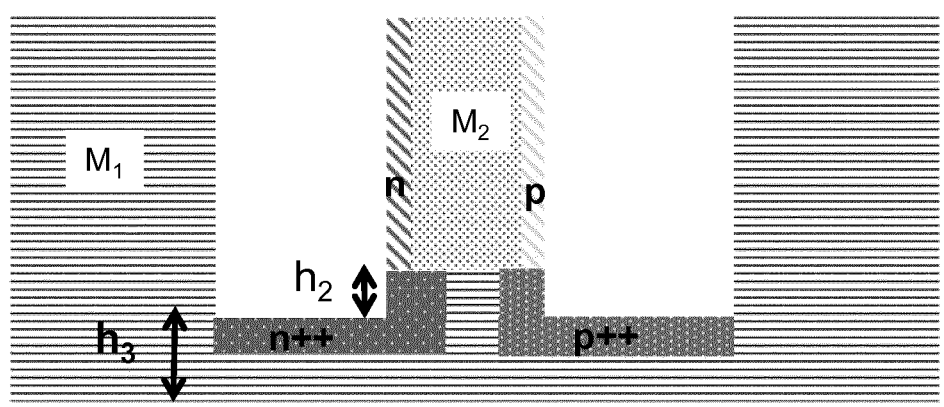
FIG. 4J depicts a further etch step in the method of manufacturing a rib waveguide modulation region.
Figure 5:
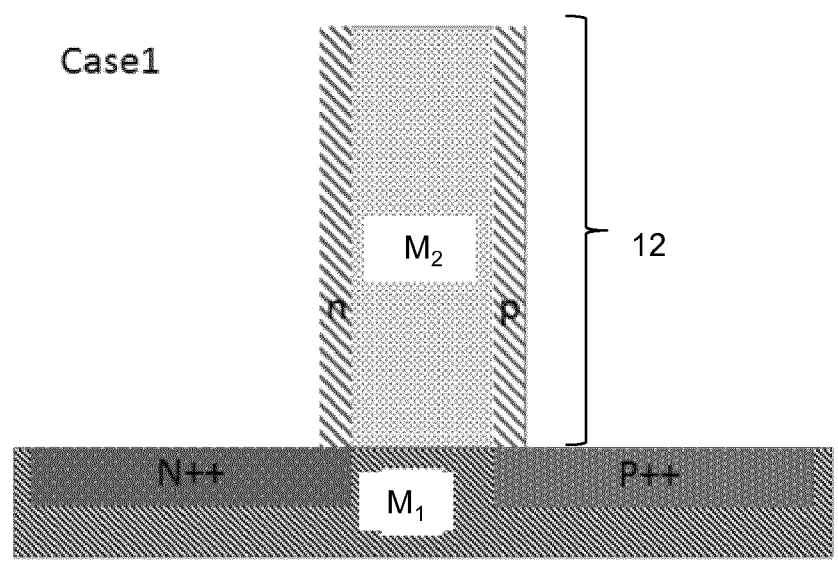
FIG. 5 depicts an alternative embodiment of a waveguide electro-absorption modulator according to the present invention.
Figure 6:
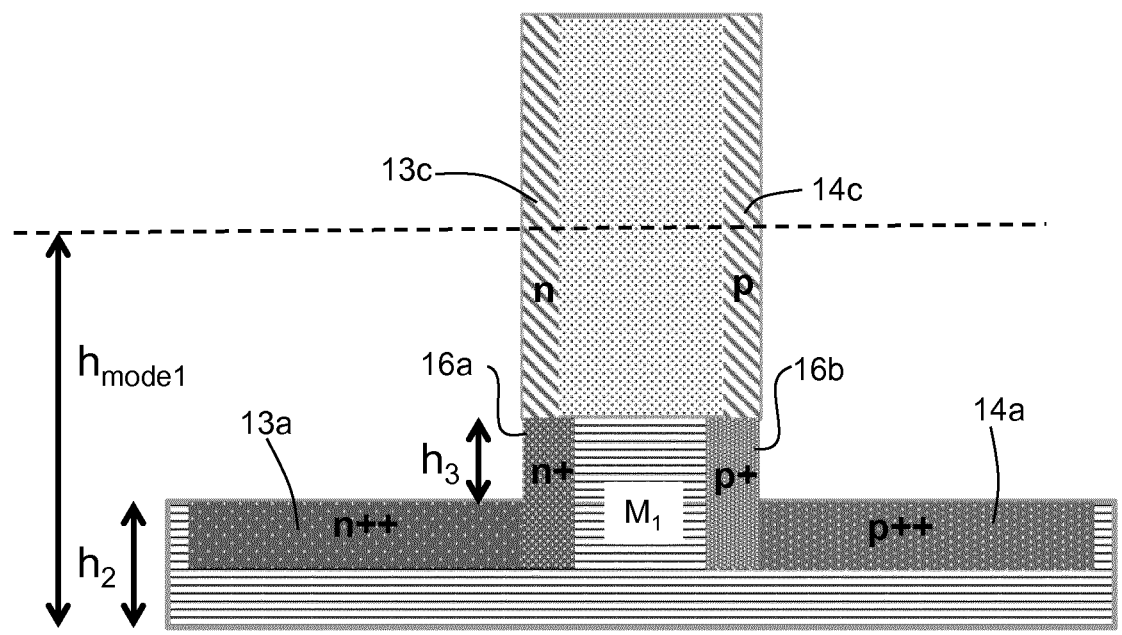
FIG. 6 depicts a further alternative embodiment of a waveguide electro-absorption modulator according to the present invention, this embodiment including further grading within the dopant regions.

FIG. 4J depicts a further etch step in which the first and second doped slab portions 13a, 14a are etched by a depth $h_2$, thereby creating the lower ridge portion 12a. For some embodiments of the optoelectronic device such as that shown in FIG. 5, there is no lower ridge 12a, so this extra etch step is not carried out. The embodiment of FIG. 5 differs from that of FIG. 2A and FIG. 3A only in that the ridge 12 of the optoelectronic device is made entirely of the second material $M_2$, so there is no lower ridge portion. Instead, the ridge is a single piece of the second material $M_2$ which extends directly from the base of the device. Finally (not shown), the remainder of the cavity walls may be etched away to leave the final device. FIG. 6 depicts a further alternative embodiment of a waveguide electro-absorption modulator according to the present invention, this embodiment differing from that of FIG. 2A in that it includes further grading within the dopant regions. The graded dopant regions include a first intermediate doped region 16a having a dopant of the same type as the first slab portion but of a dopant concentration between that of the first doped slab portion and the first doped sidewall; and a second intermediate doped region 16b having a dopant of the same type as the first slab portion but of a dopant concentration between that of the second doped slab portion and that of the second doped sidewall. The first and second intermediate doped regions may be applied in the same method as the sidewall doped portions but using a steeper implantation angle (i.e. the angle of implantation angle makes a smaller angle with the sidewall than the angle of implantation used for the sidewall doping.

Figure 7A:
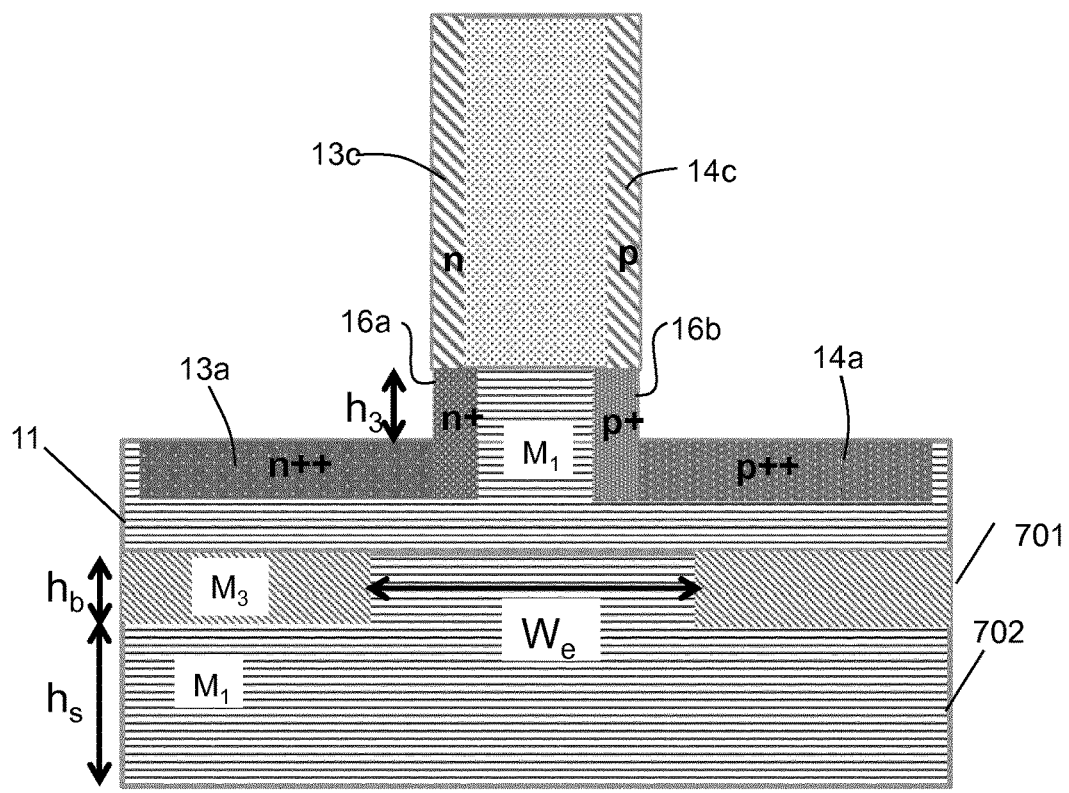
FIG. 7*a* depicts a cross-section along the line A-A' of a variant device.
Figure 7B:
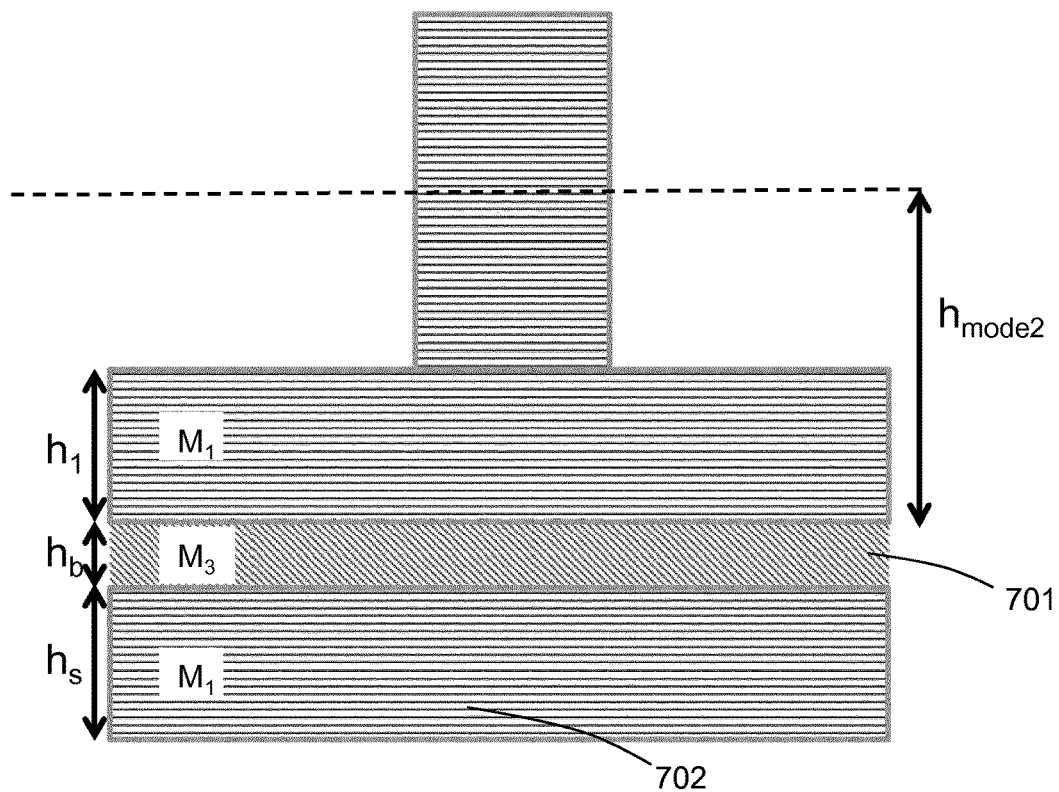
FIG. 7*b* depicts a cross-section along the line B-B' of a variant device.

FIGS. 7A and 7B depict a further alternative embodiment of a waveguide electro-absorption modulator according to the present invention, along the lines A-A' and B-B' respectively. This embodiment differs from that shown in FIG. 6 in that the device further includes a region 701 formed of a lower refractive index material $M_3$ (for example, silicon oxide) as well as a further substrate material 702 (for example, silicon). This may be provided by etching a region of the region 701, so as to provide a cavity with width $W_e$, and then to grow further substrate material into that cavity. The width $W_e$ in this example has a value from 0.5 µm to 20

μm. The region 701, as shown in FIG. 7A, can be characterized in having a gap therein which is below the active waveguide region. The region 701 has a height $h_b$ in this example from 0.2 μm to 4 μm. The substrate material 702 may have a thickness from 200 μm to 800 μm. The part of the device shown in FIG. 7B has a complete region 701 below the passive waveguide i.e. it has not been etched, and so is substantially continuous. This structure can improve mode matching from the passive waveguide shown in FIG. 7B to the active waveguide shown in FIG. 7A.

Figure 8:
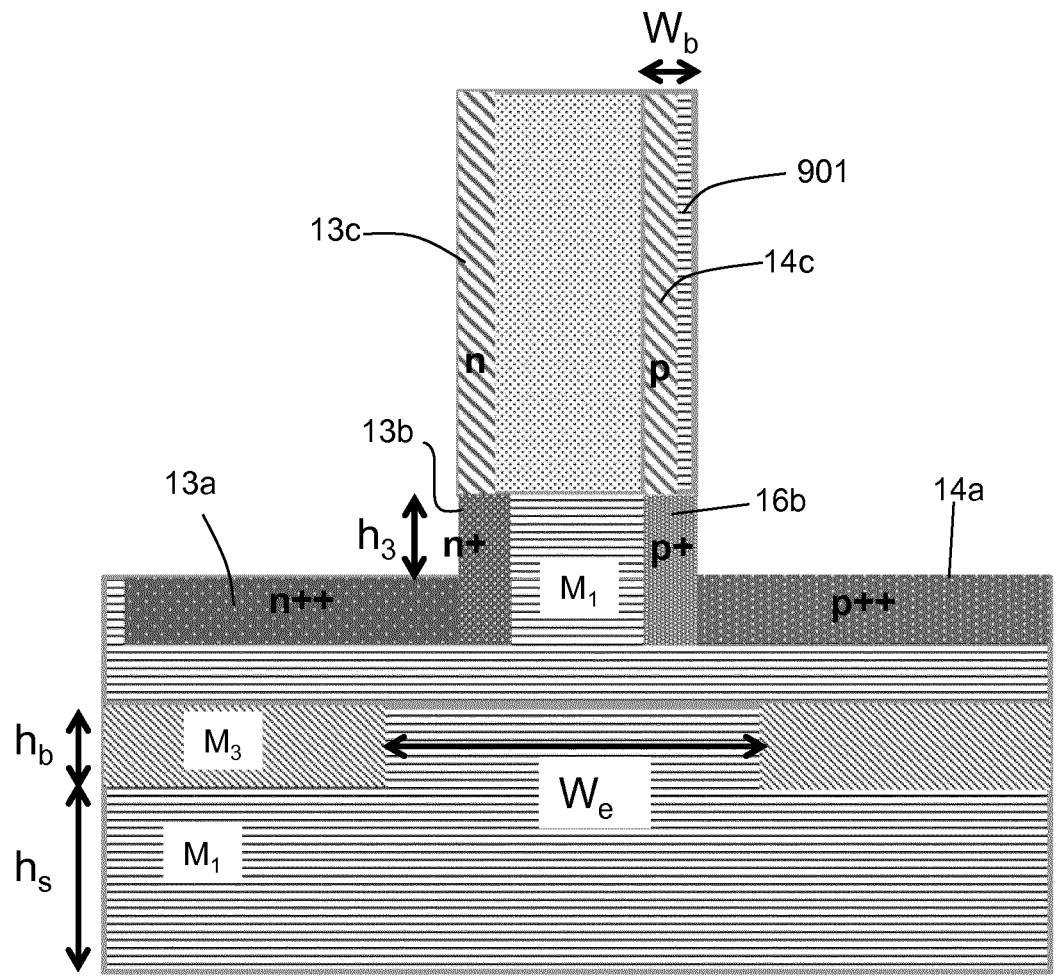
FIG. 8 depicts a cross-section along the line A-A' of a further variant device.

FIG. 8 shows a further alternative embodiment of a waveguide electro-absorption modulator according to the present invention, along the line A-A'. This embodiment differs from that shown in FIG. 7a in that one upper sidewall portion 14c of the waveguide comprises a silicon region 901, having a width $W_b$ which is within the range 0.1 μm to 0.4 μm. The silicon upper sidewall portion 901 is either entirely or partially n or p doped, while the opposite upper sidewall portion 13c is formed of SiGe or Ge and contains dopants of an opposite polarity to the silicon upper sidewall portion. The addition of a silicon sidewall helps reduce the capacitance of the device, and can therefore increase the operational radio-frequency bandwidth.

Although exemplary embodiments of a waveguide electro-absorption modulator and method of manufacturing a rib waveguide modulation region have been specifically described and illustrated herein, many modifications and variations will be apparent to those skilled in the art. Accordingly, it is to be understood that a waveguide electro-absorption modulator constructed according to principles of this invention may be embodied other than as specifically described herein. The invention is also defined in the following claims, and equivalents thereof

What is claimed is:

1. A waveguide optoelectronic device, comprising a rib waveguide region, the rib waveguide region having a silicon base and a ridge extending from the silicon base,
   wherein the silicon base includes a first slab region at a first side of the ridge and a second slab region at a second side of the ridge,
   wherein:
      a first doped region extends along: the first slab region and along a first sidewall of the ridge, the first sidewall contacting the first slab region; and
      a second doped region extends along: the second slab region and along a second sidewall of the ridge, the second sidewall contacting the second slab region,
   wherein the ridge comprises:
      a lower ridge portion in contact with and extending away from the silicon base, the silicon base and the lower ridge portion both including silicon; and
      an upper ridge portion in contact with and extending away from the lower ridge portion, the upper ridge portion including a semiconductor material that is different from silicon, and
   wherein:
      the first doped region which extends along the first sidewall includes a lower sidewall portion located at the lower ridge portion and an upper sidewall region located at the upper ridge portion; and
      the second doped region which extends along the second sidewall includes a lower sidewall portion located at the lower ridge portion and an upper sidewall region located at the upper ridge portion.

2. The waveguide optoelectronic device of claim 1, further comprising:
   a first electrical contact; and
   a second electrical contact,
   wherein the first electrical contact is in direct contact with the first slab region and the second electrical contact is in direct contact with the second slab region, and
   wherein the silicon base is composed of silicon.

3. The waveguide optoelectronic device of claim 2, wherein the waveguide optoelectronic device is:
   a waveguide electro absorption modulator (EAM) and the rib waveguide region is a rib waveguide modulation region; or
   a waveguide photodiode (PD).

4. The waveguide optoelectronic device of claim 2, wherein the semiconductor material is silicon germanium (SiGe), a metal alloy of silicon, a metal alloy of germanium, or a metal alloy of SiGe.

5. The waveguide optoelectronic device of claim 4, wherein the semiconductor material is GeSn or SiGeSn.

6. The waveguide optoelectronic device of claim 2, wherein:
   the first electrical contact is located on top of the first slab region; and
   the second electrical contact is located on top of the second slab region.

7. The waveguide optoelectronic device of claim 2, wherein the first doped region is n doped and the second doped region is p doped.

8. A method of manufacturing the waveguide optoelectronic device of claim 1, the method comprising the steps of:
   providing a layer of silicon;
   etching a cavity into the layer, the cavity having a base, a first cavity edge and a second cavity edge;
   implanting the base with a first dopant to create a first doped slab region;
   implanting the base with a second dopant to create a second doped slab region laterally spaced from the first doped slab region;
   growing the semiconductor material within the cavity;
   etching the semiconductor material to form a waveguide ridge which lies within the cavity and extends upwards from the base and overlies a portion of the first doped slab region and a portion of the second doped slab region, the waveguide ridge having the first sidewall which contacts the first doped slab region and the second sidewall which contacts the second doped slab region;
   implanting the first sidewall with the first dopant;
   implanting the second sidewall with the second dopant; and
   etching away the first cavity edge and the second cavity edge.

9. The method of claim 8, wherein the step of etching a cavity into the layer is a deep etching step and the etch has a depth of at least 2 μm.

10. The method of claim 8, further comprising the step of:
    creating the lower ridge portion composed of the silicon directly underneath the waveguide ridge by:
    etching the first doped slab region by a height which is less than an unetched height of the first doped slab region; and
    etching the second doped slab region by a height which is less than an unetched height of the second doped slab region.

11. The method of claim 8, wherein the semiconductor material is silicon germanium (SiGe), a metal alloy of silicon, a metal alloy of germanium, or a metal alloy of SiGe.

12. The method of claim 11, wherein the semiconductor material is GeSn or SiGeSn.

13. The waveguide optoelectronic device of claim 1, wherein each of the lower sidewall portion of the first doped region, the lower sidewall portion of the second doped region, the first slab region, and the second slab region has a respective dopant concentration that is higher than a dopant concentration of the upper sidewall region of the first doped region and higher than a dopant concentration of the upper sidewall region of the second doped region.

14. The waveguide optoelectronic device of claim 13, wherein each of the first slab region and the second slab region has a respective dopant concentration that is higher than a dopant concentration of the lower sidewall portion of the first doped region and higher than a dopant concentration of the lower sidewall portion of the second doped region.

15. The waveguide optoelectronic device of claim 1, wherein each of a distance by which the lower sidewall portion of the first doped region extends into the ridge and a distance by which the lower sidewall portion of the second doped region extends into the ridge is greater than a distance by which the upper sidewall region of the first doped region extends into the ridge and greater than a distance by which the upper sidewall region of the second doped region extends into the ridge.

16. The waveguide optoelectronic device of claim 1, further comprising:
an input rib waveguide coupled to an input of the rib waveguide region to couple light into the rib waveguide region; and
an output rib waveguide coupled to an output of the rib waveguide region to couple light out of the rib waveguide region.

17. The waveguide optoelectronic device of claim 16, wherein a height of the silicon base, a height of the lower sidewall portion of the first doped region, and a height of the lower sidewall portion of the second doped region are such that the mode center of the rib waveguide region is located at the same height above the silicon base as the mode center of the input rib waveguide, the output rib waveguide, or the input rib waveguide and the output rib waveguide.

18. The waveguide optoelectronic device of claim 1, further comprising:
a silicon substrate below the silicon base; and
a crystalline cladding layer between the silicon base and the silicon substrate.

19. The waveguide optoelectronic device of claim 18, further comprising a buried oxide layer, disposed on opposing horizontal sides of the crystalline cladding layer, wherein the crystalline cladding layer is a material which is different than the buried oxide layer.

20. The waveguide optoelectronic device of claim 1, wherein the lower ridge portion is composed of silicon and the upper ridge portion is composed of the semiconductor material.

* * * * *